United States Patent
Choi et al.

(10) Patent No.: US 9,230,659 B2
(45) Date of Patent: Jan. 5, 2016

(54) NONVOLATILE MEMORY DEVICE CAPABLE OF REDUCING A SETUP/PRECHARGE SPEED OF A BITLINE FOR REDUCING PEAK CURRENT AND RELATED PROGRAMMING METHOD

(71) Applicant: SAMSUNG ELECTRONICS CO., LTD., Suwon-si, Gyeonggi-do (KR)

(72) Inventors: Yoon-Hee Choi, Hwaseong-si (KR); Sang-Wan Nam, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 137 days.

(21) Appl. No.: 14/223,368

(22) Filed: Mar. 24, 2014

(65) Prior Publication Data

US 2015/0003167 A1    Jan. 1, 2015

(30) Foreign Application Priority Data

Jun. 26, 2013    (KR) .................. 10-2013-0073875

(51) Int. Cl.

| | | |
|---|---|---|
| G11C 5/14 | (2006.01) | |
| G11C 16/10 | (2006.01) | |
| G11C 16/04 | (2006.01) | |
| G11C 16/34 | (2006.01) | |
| G11C 16/24 | (2006.01) | |

(52) U.S. Cl.
CPC ............ G11C 16/10 (2013.01); G11C 16/0483 (2013.01); G11C 16/3459 (2013.01); *G11C 16/24* (2013.01)

(58) Field of Classification Search
CPC ..... G11C 16/0483; G11C 16/12; G11C 16/24

USPC ........... 365/185.17, 185.19, 185.25, 227, 226
See application file for complete search history.

(56) References Cited

U.S. PATENT DOCUMENTS

| | | |
|---|---|---|
| 5,719,812 A | 2/1998 | Seki et al. |
| 6,236,611 B1 | 5/2001 | Naji |
| 6,587,374 B2 | 7/2003 | Takagi et al. |
| 7,085,189 B2 | 8/2006 | Horii et al. |
| 7,158,412 B2 | 1/2007 | Rodgers, III et al. |
| 7,646,646 B2 * | 1/2010 | Hosomura ......... G11C 16/3418 365/185.17 |
| 7,898,871 B2 | 3/2011 | Byeon |
| 8,824,232 B2 * | 9/2014 | Yoo .......................... G11C 7/12 365/203 |
| 2010/0157683 A1 | 6/2010 | Nguyen |
| 2011/0013457 A1 | 1/2011 | Han |

(Continued)

FOREIGN PATENT DOCUMENTS

| | | |
|---|---|---|
| JP | 2012-022740 A | 2/2012 |
| KR | 10-0476930 B1 | 3/2005 |
| KR | 10-0748070 B1 | 8/2007 |

(Continued)

*Primary Examiner* — Andrew Q Tran
(74) *Attorney, Agent, or Firm* — Volentine & Whitt, PLLC

(57) ABSTRACT

A method of programming a memory cell of a nonvolatile memory device by executing a plurality of program loops comprises detecting whether a loop count or a level of a program pulse to be applied to the memory cell is within a specific range, wherein the specific range is an operation section in which a level of a current peak flowing into the bitline increases up to a reference value or more, charging a bitline of the memory cell at a first charging speed or a second charging speed slower than the first charging speed according to a result of the detection, and applying the program pulse to a wordline of the memory cell.

20 Claims, 19 Drawing Sheets

(56) References Cited

U.S. PATENT DOCUMENTS

2012/0063224 A1 3/2012 Edahiro
2012/0140579 A1 6/2012 Kim et al.

FOREIGN PATENT DOCUMENTS

KR 10-0818097 B1 3/2008
KR 10-1014405 B1 2/2011

* cited by examiner

NONVOLATILE MEMORY DEVICE CAPABLE OF REDUCING A SETUP/PRECHARGE SPEED OF A BITLINE FOR REDUCING PEAK CURRENT AND RELATED PROGRAMMING METHOD

CROSS-REFERENCE TO RELATED APPLICATIONS

This application claims priority under 35 U.S.C. §119 to Korean Patent Application No. 10-2013-0073875 filed on Jun. 26, 2013, the subject matter of which is hereby incorporated by reference.

BACKGROUND OF THE INVENTION

The inventive concept relates generally to semiconductor memory devices, and more particularly to a nonvolatile memory device and related programming method designed to reduce a current peak.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include DRAM and SRAM, and examples of nonvolatile memory devices include flash, PRAM, RRAM, and MRAM.

Among nonvolatile memory devices, flash memory devices have achieved increasing popularity in recent years due to attractive features such as relatively high storage capacity, efficient operating speed, relatively low cost, and relatively high durability. Accordingly, flash memory devices are currently used to provide nonvolatile data storage in a wide variety of electronic devices, such as computers, cellular phones, smart phones, digital cameras, camcorders, voice recorders, MP3 players, personal digital assistants (PDAs), handheld PCs, game machines, fax machines, scanners, printers, etc.

Due to the ever increasing demand for flash memory devices, researchers are engaged in continual efforts to improve the storage capacity, speed, reliability, power consumption, and other performance characteristics of flash memory devices.

SUMMARY

In one embodiment of the inventive concept, a method of programming a memory cell of a nonvolatile memory device by executing a plurality of program loops comprises detecting whether a loop count or a level of a program pulse to be applied to the memory cell is within a specific range, wherein the specific range is an operation section in which a level of a current peak flowing into the bitline increases up to a reference value or more, charging a bitline of the memory cell at a first charging speed or a second charging speed slower than the first charging speed according to a result of the detection, and applying the program pulse to a wordline of the memory cell.

In another embodiment of the inventive concept, a nonvolatile memory device comprises a cell array comprising a plurality of memory cells, a page buffer configured to provide a setup voltage or a precharge voltage to a bitline of a selected memory cell where a program operation is performed, and a control logic configured to control the page buffer such that the bitline is charged at the first charging speed or the second charging speed based on a loop count or a level of a program pulse to be applied to the selected memory cell where a program operation is performed.

In yet another embodiment of the inventive concept, a system configured to program a memory cell of a nonvolatile memory device by executing a plurality of program loops comprises a control unit configured to detect whether a loop count or a level of a program pulse to be applied to the memory cell is within a specific range, wherein the specific range is an operation section in which a level of a current peak flowing into the bitline increases up to a reference value or more, a charging unit configured to charge a bitline of the memory cell at a first charging speed or a second charging speed slower than the first charging speed according to a result of the detection, and a program pulse application unit configured to apply the program pulse to a wordline of the memory cell.

These and other embodiments of the inventive concept can potentially reduce power consumption by suppressing a current peak that occurs where a program operation is performed. It can also improve the reliability of stored data by reducing noise associated with the current peak.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
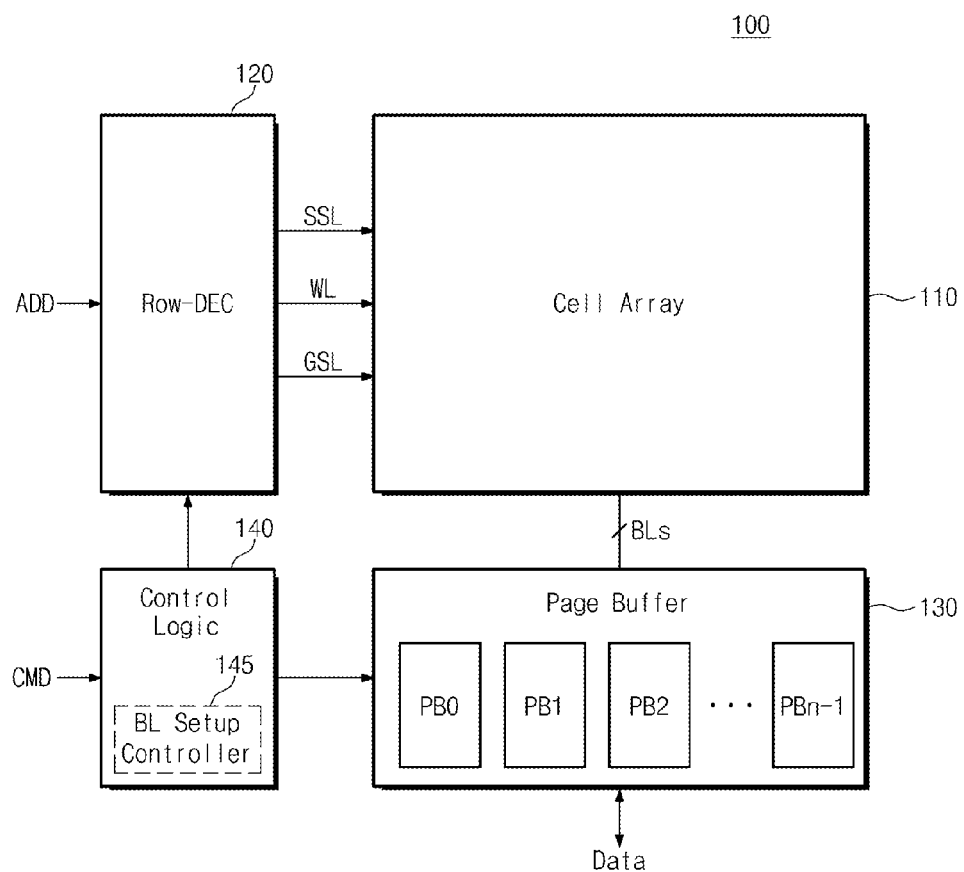
FIG. 1 is a block diagram illustrating a nonvolatile memory device according to an embodiment of the inventive concept.

FIG. 1 is a block diagram illustrating a nonvolatile memory device 100 according to an embodiment of the inventive concept.

Referring to FIG. 1, nonvolatile memory device 100 comprises a cell array 110, a row decoder 120, a page buffer 130 and control logic 140.

Cell array 110 is connected to row decoder 120 through wordlines WLs and selection lines SSL and GSL. Cell array 110 is connected to page buffer 130 through bitlines BLs. Cell array 110 comprises a plurality of NAND cell strings. A channel of each of the cell strings may be vertically or horizontally formed. Cell array 110 comprises a plurality of memory cells forming the NAND cell string. The memory cells can be programmed, erased and read by a voltage being provided to bitlines BLs and wordlines WLs.

Row decoder 120 can select any one of memory blocks of cell array 110 in response to an address ADD. Row decoder 120 can select any one of wordlines of the selected memory block in response to an address ADD. Row decoder 120 transmits a voltage corresponding to an operation mode to the selected wordline of the memory block. Where a program operation is performed, row decoder 120 transmits a program voltage Vpgm and a verifying voltage Vfy to the selected wordline and transmits a pass voltage Vpass to unselected wordlines. Where a read operation is performed, row decoder 120 transmits a select read voltage Vrd to a selected wordline and transmits an unselect read voltage Vread to an unselected wordline.

Page buffer 130 operates as a write driver or a sense amplifier. Where a program operation is performed, page buffer 130 transmits a bitline voltage corresponding to data to be programmed to a bitline of cell array 110. Where a read operation or a verification-read operation is performed, page buffer 130 senses data stored in a selected memory cell through a bitline BL. Each of a plurality of page buffers PB0~PBn-1 in page buffer 130 can be connected to one bitline or two bitlines.

Each of page buffers PB0~PBn-1 sets up a selected bitline where a program operation is performed. Herein, the 'bitline set-up' means an operation of charging a bitline of memory cells to be programmed with 0V and a bitline of program inhibited memory cells with a drive voltage (VDD or Vcc) before applying a program voltage Vpgm. A channel of a cell string can be self-boosted through a charge of a program inhibit bitline. A channel voltage of a cell string selected by a self boosting rises together with a program voltage Vpgm due to coupling.

In general, the amount of inflowing charges to charge a bitline having a relatively higher capacity tends to increase rapidly. That is, the amount of inflowing charges rapidly increases over time, so a large amount of current flows and thereby a current peak may occur. Page buffer 130 can suppress a rapid increase of the amount of flowing current according to a control of control logic 140.

Charging of a bitline can occur where a program verify operation is performed. Charging of a bitline is performed in advance to sense data stored in a selected memory cell. At this time, a current peak may occur due to the charging of a bitline. Page buffer 130 can improve problems that occur due to a current peak by controlling a rapid inflow of charges that occurs where a program operation is performed.

Control logic 140 controls page buffer 130 and row decoder 120 according to a command CMD being transmitted from an external source. Control logic 140 can control page buffer 130 and row decoder 120 according to command CMD so that program, read and erase operations are performed on a selected memory cell.

Control logic 140 comprises a bitline setup controller 145 to control a bitline setup operation of page buffer 130. Bitline setup controller 145 controls charging time of a bitline where a program or read operation is performed. For example, bitline setup controller 145 may control time that a bitline voltage rises from 0V to a power supply voltage VDD. The control of rising time is to prevent a peak of current rapidly flowing into a bitline. Bitline setup controller 145 can control a speed of charge of a bitline with reference to a level of a program loop count (Loop_cnt) or a level of a program pulse.

Where a level of a program loop count (Loop_cnt) or a level of a program pulse is within a specific range, bitline setup controller 145 can change setup or precharge time of a bitline. Bitline setup controller 145 may comprise a storage device to provide information about the specific range. A speed of charging a bitline is dependent on a level of current peak that occurs where a program operation is performed. Nonvolatile memory device 100 can suppress a current peak caused by charge of a bitline by changing charge time of a bitline at a specific program loop or a specific program pulse level.

Figure 2:
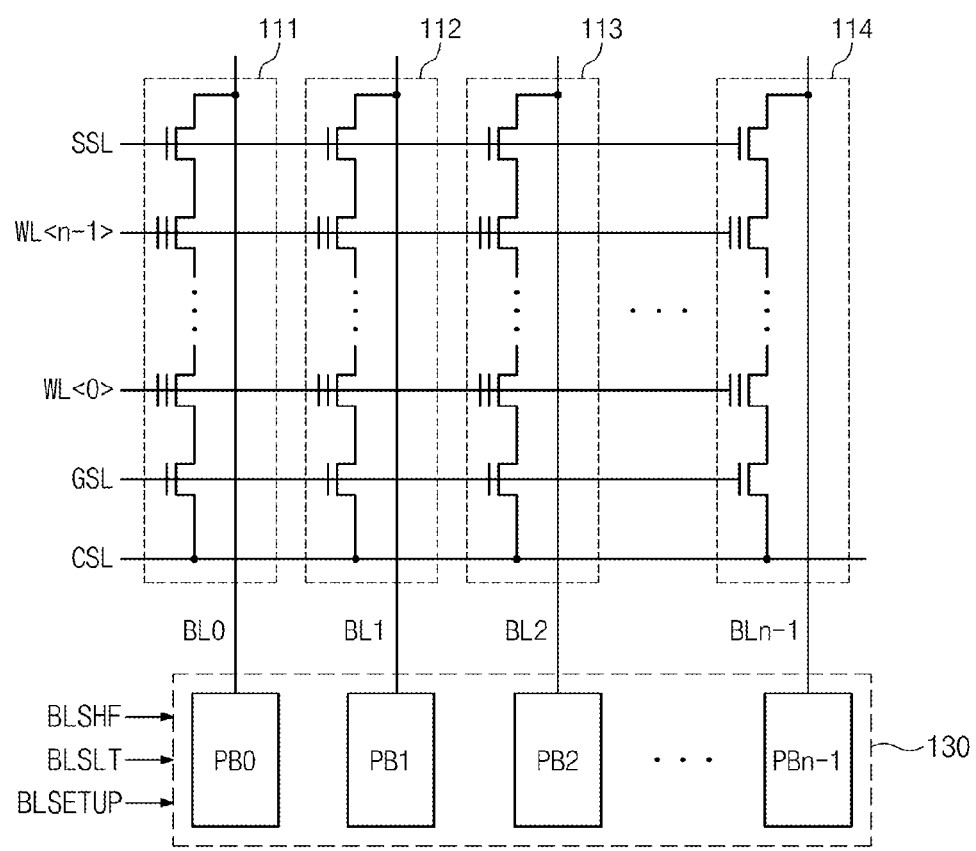
FIG. 2 is a block diagram illustrating a cell array and a page buffer according to an embodiment of the inventive concept.

FIG. 2 is a block diagram illustrating a cell array and a page buffer according to an embodiment of the inventive concept. Referring to FIG. 2, page buffers PB0~PBn-1 are connected to respective bitlines BL0~BLn-1. Bitlines BL0~BLn-1 are connected to respective NAND cell strings 111, 112, 113, . . . , 114.

NAND cell strings 111, 112, 113, . . . , 114 which are distributed in cell array 110 are respectively connected to bitlines BL through string select transistors SST. A gate of each string select transistor SST is connected to a string select line SSL. NAND cell strings 111, 112, 113, . . . , 114 are respectively connected to a common source line CSL through ground select transistors GST. A gate of each ground select transistor GST is connected to a ground select line GSL.

Page buffer PB0 is connected to NAND cell string 111 through bitline BL0. Page buffer PB0 sets up or precharges bitline BL0 where a program operation is performed. Page buffer PB0 can sets up bitline BL0 to 0V or a power supply voltage VDD to perform a program operation. Page buffer PB0 can precharge bitline BL0 to perform a verification-read operation. Page buffer PB0 comprises transistors to supply a power supply voltage VDD to bitline BL0. Page buffer BL0 is provided with control signals BLSHF, BLSLT and BLSETUP for controlling the transistors from control logic 140. Where a program operation is performed by control signals BLSHF, BLSLT and BLSETUP, a bitline setup speed or a precharge speed can be controlled.

Page buffers PB1~PBn-1 can setup or precharge respective bitlines according to the same procedure as page buffer PB0 described above.

Figure 3:
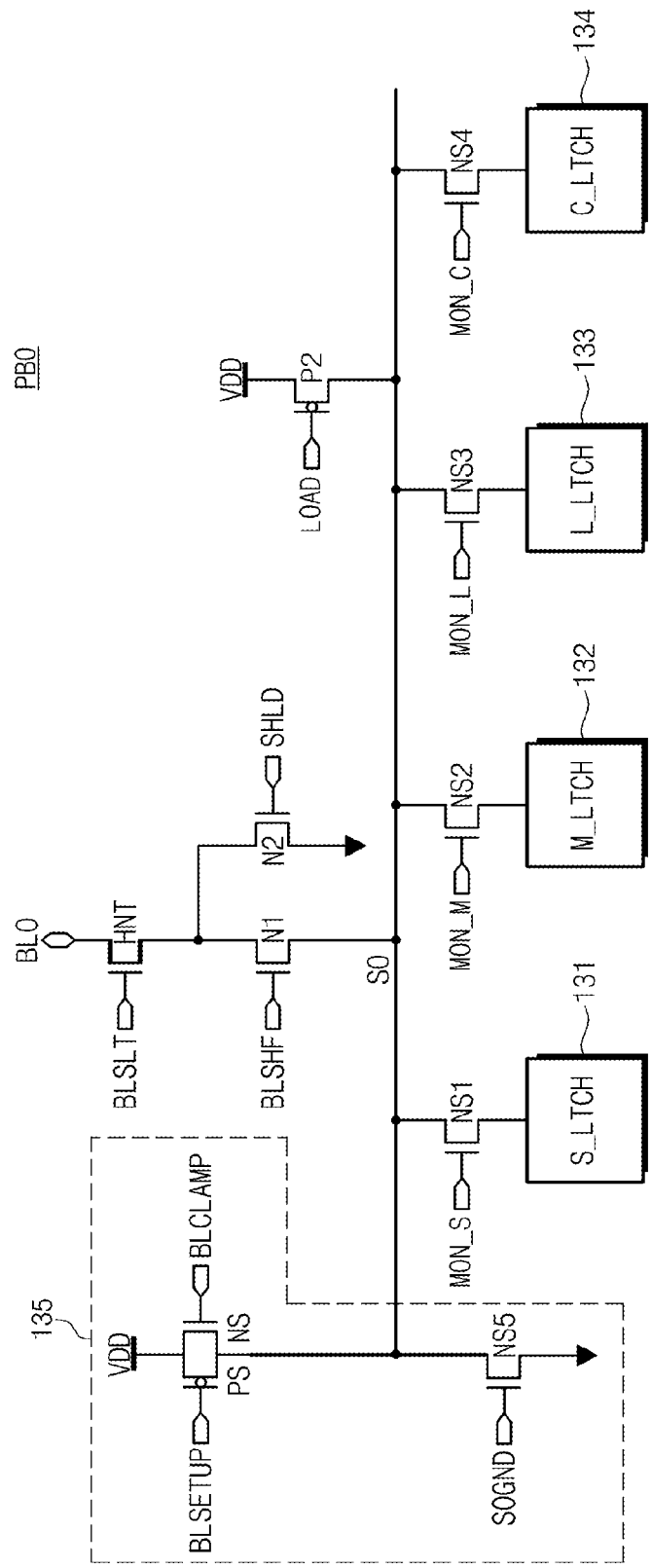
FIG. 3 is a block diagram illustrating a structure of a page buffer of FIG. 1 or 2, according to an embodiment of the inventive concept.

FIG. 3 is a block diagram illustrating a structure of a page buffer of FIG. 1 or 2, according to an embodiment of the inventive concept.

Referring to FIG. 3, page buffer PB0 connected to bitline BL0 can be connected to memory cells of NAND string 111. Page buffer PB0 comprises a sensing node S0 connected to bitline BL0. Page buffer PB0 comprises a sensing latch 131, data latches 132 and 133, a cache latch 134 and a setup circuit 135.

Where a program operation is performed, bitline BL0 can be set up by setup circuit 135. For example, where control signals BLSHF, BLSLT and BLSETUP are activated, select transistors HNT, N1 and PS are turned on. Then, bitline BL0 is charged with electric charges by a power supply voltage VDD provided from setup circuit 135. According to some embodiments of the inventive concept, rising time of control signal BLSHF can be changed. That is, control signal BLSHF can reach a target level with a rising slope according to a program loop count. However, in a specific program loop count, control signal BLSHF can be provided with a relatively small rising slope. A current peak that occurs in a setup operation of bitline BL0 can be controlled by changing a slope of control signal BLSHF being provided to a gate of select transistor N1.

To perform a program operation, page buffer PB0 precharges bitline BL0 to sense whether a selected memory cell is turned on or off. Bitline BL0 is precharged to perform a program verification operation. At this time, control signals BLSETUP and SOGND may be applied to setup circuit 135 to inactivate setup circuit 135. To precharge bitline BL0, a load switch P2 is turned on and select transistors INT and N1 are turned on. Even at this time, a rising time of control signal BLSHF can be changed. That is, a rising slope of control signal BLSHF can be changed depending on a loop count or a level of a program pulse being provided from a corresponding loop count. A current peak that occurs where a precharge operation of bitline BL0 is performed can be suppressed by changing a rising slope of control signal BLSHF for controlling select transistor N1.

Page buffers PB1~PBn-1 in page buffer 130 perform the same function as page buffer PB0. Thus, page buffer 130 can effectively suppress a current peak that occurs where a program operation is performed.

Figure 4:
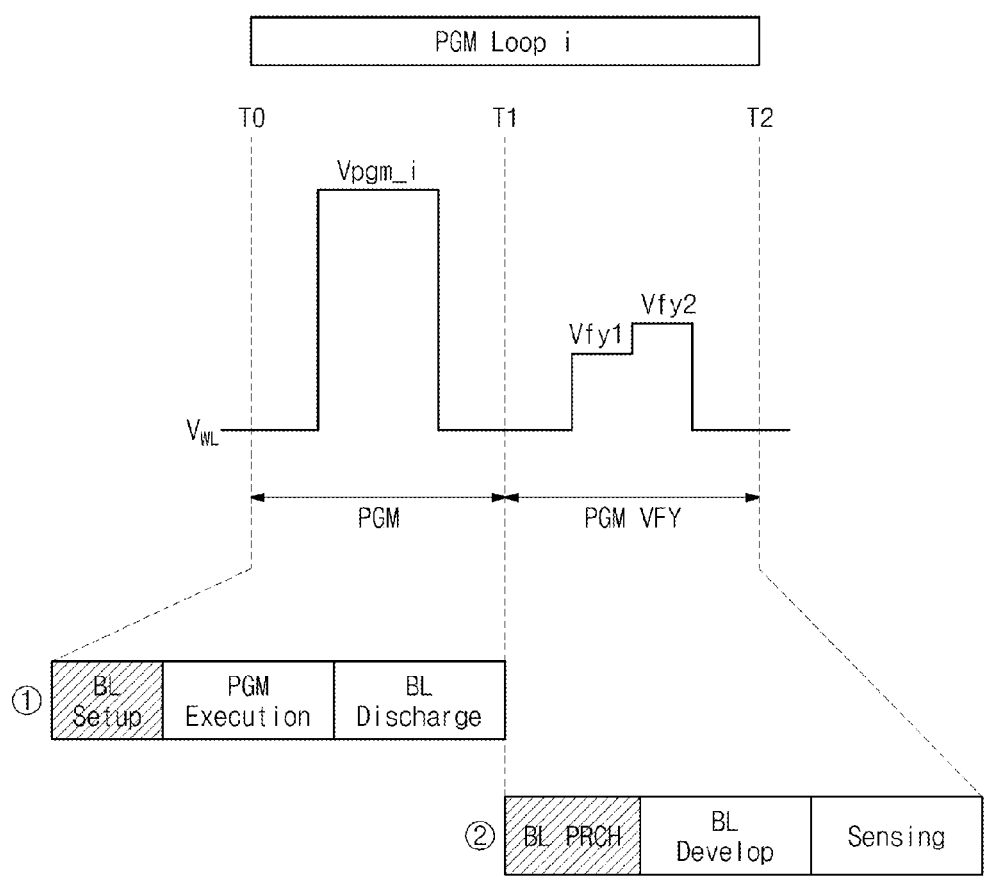
FIG. 4 is a waveform diagram illustrating a control operation of a wordline and a bitline where a program operation is performed, according to an embodiment of the inventive concept.

FIG. 4 is a waveform diagram illustrating a control operation of a wordline and a bitline where a program operation is performed, according to an embodiment of the inventive concept.

Referring to FIG. 4, a wordline voltage $V_{WL}$ and an operation of page buffer 130 in a program loop section PGM i, (i is a natural number) are illustrated as an illustration.

Program loop section PGM i can be divided into a program section PGM and a program verification section PGM VFY. A program pulse Vpgm_i is applied to wordlines WLs of selected memory cells during program section PGM. In the illustrated waveform diagram, a section between time T0 and time T1 corresponds to program section PGM. program section PGM is indicated by a quotation mark ①. Program section PGM can be divided into a bitline setup section, a program execution section and a bitline discharge section.

An operation of charging a bitline of memory cells selected in the bitline setup section with a power supply voltage VDD or 0V is performed. A bitline of memory cells to be programmed in a target state in the bitline setup section is set to 0V. Bitlines of program inhibited memory cells are set to power supply voltage VDD. According to some embodiments of the inventive concept, a setup speed of a bitline being set to power supply voltage VDD may be changed depending on the number of program loops or a level of program pulse Vpgm_i.

The program execution section continues after the bitline setup section. In the program execution section, program pulse Vpam_i is applied to a wordline of the selected memory cells. After program pulse Vpam_i is applied, the bitline discharge section continues. A bitline voltage which is set up in the bitline discharge section is discharged to a ground level.

Program verification section PGM VFY corresponds to a section between time T1 to time T2 in the illustrated waveform diagram. Program verification section PGM VFY is indicated by a quotation mark ②. A read operation for detecting whether a program operation with respect to the selected memory cells succeeds is performed in program verification section PGM VFY. Verifying voltages vfy1 and vfy2 may be applied to a selected wordline in program verification section PGM VFY. Program verification section PGM VFY comprises a bitline precharge section BL PRCH, a bitline develop section and a sensing section. The sensing section may be divided into a sensing node develop and a sensing node. The whole control of the program verification section can be performed on each of the verifying voltages vfy1 and vfy2. The verifying voltages are illustrated to provide two levels but three or more verifying voltages can be provided.

According to some embodiments of the inventive concept, a precharge speed of a bitline in the bitline precharge section may be changed depending on the number of the program loops (PGM Loop_i or a loop count) or a level of program pulse Vpgm_i. That is, in a program loop having high reliability that a current peak occurs or a loop section to which a program pulse having a specific level is applied, a bitline setup or a precharge speed can be controlled to be low to suppress occurrence of a current peak.

A setup or precharge operation of a bitline was described in one program loop PGM Loop i. In a setup or precharge operation of a bitline, the amount of charge flowing into bitlines is relatively large, so a current peak may occur. However, the inventive concept can reduce a setup or precharge speed of a bitline in a specific loop, occurrence of a current peak can be effectively suppressed.

Figure 5:
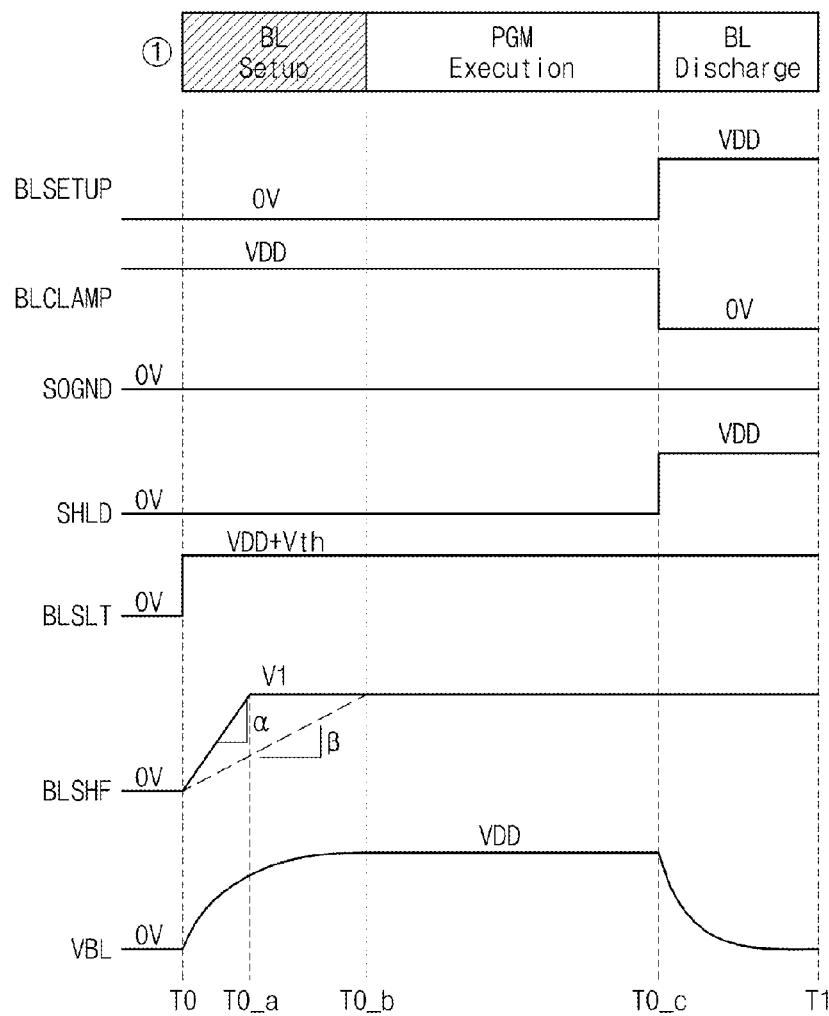
FIG. 5 is a waveform diagram illustrating an operation that occurs in a program section, according to an embodiment of the inventive concept.

FIG. 5 is a waveform diagram illustrating an operation that occurs in the program section of FIG. 4, according to an embodiment of the inventive concept. A setup operation of a bitline during program section PGM is described with reference to FIGS. 3 and 5.

Referring to FIG. 5, a setup operation of a bitline for a program begins at time T0. To perform a setup of a bitline, control signals BLSETUP, SOGND and SHLD are provided to have 0V and control signals BLCLAMP and BLSLT are provided to have a power supply voltage VDD or a voltage VDD+Vth higher than power supply voltage VDD. Then, setup transistor PS and select transistors HNT are turned on. Gate signal BLSHF being input to a gate of selection transistor N1 gradually increases. Charges are charged in a bitline through select transistor N1 of which a gate voltage rises as control signal BLSHF increases.

According to a method of applying control signal BLSHF, control signal BLSHF rises with a slope α in a specific loop count (Loop_cnt). Where control signal BLSHF reaches a target level V1, control signal BLSHF does not change any more and is fixed to target level V1. In this case, setup time of control signal BLSHF corresponds to a relatively short section T0~T0_a. Control signal BLSHF rises with a slope β in a loop count (Loop_cnt) in which a relatively large amount of current is consumed. If control signal BLSHF reaches a target level V1, control signal BLSHF does not change any more and is fixed to target level V1. Where control signal BLSHF rises with a relatively small slope β, setup time of control signal BLSHF corresponds to a relatively long section T0~T0_b.

The amount of charge flowing into a bitline through select transistor N1 can be controlled by controlling a rising slope of control signal BLSHF. Because a time rate of change of charge amount becomes an amount of inflowing current, this function means that it can lower a level of a current peak.

According to a described setup method of a bitline, a level of a current peak that occurs in a setup section of a bitline by controlling a rising speed or rising time of control signal BLSHF. A rising slope of control signal BLSHF can be selected according to the number of program loops or a level of a program voltage. Through that function described above, control signal BLSHF can be provided which has a relatively small rising slope at a setup operation of a bitline of program time having a relatively large current peak.

At time T0_b, a setup of a bitline is completed and a program pulse Vpgm_i is applied. At this time, a program inhibit bitline maintains a level of a power supply voltage VDD. A program execution section ends at time T0_c.

At time T0_c, a bitline discharge operation is performed. To discharge charges which are charged in a bitline, control signals BLSETUP and BLCLAMP transit to a VDD level and 0V respectively so that setup transistor PS and clamp transistor NS are turned off. Control signal BLSHF is grounded to 0V to turn off select transistor N1. If control signal SHLD rises to a level of a power supply voltage VDD, a shield transistor N2 is turned on. At this time, a bitline BL0 is grounded and charges which are charged in bitline BL0 are discharged. A result of a setup and a discharge of bitline BL0 can be checked through an electric potential change of a bitline voltage VBL.

According to the embodiment described in relation to FIG. 5, a setup speed of a bitline can be controlled with reference to a program loop count (PGM Loop_i) or a program pulse level. A current peak can greatly occur in a specific loop depending on a coupling or a threshold voltage change of memory cells. According to a described programming method, a setup speed of a bitline in the program loop can be controlled to be low. Thus, a time rate of change of charge amount flowing into a bitline becomes low. That is, where a bitline setup operation is performed, a level of a current peak can be suppressed.

Figure 6:
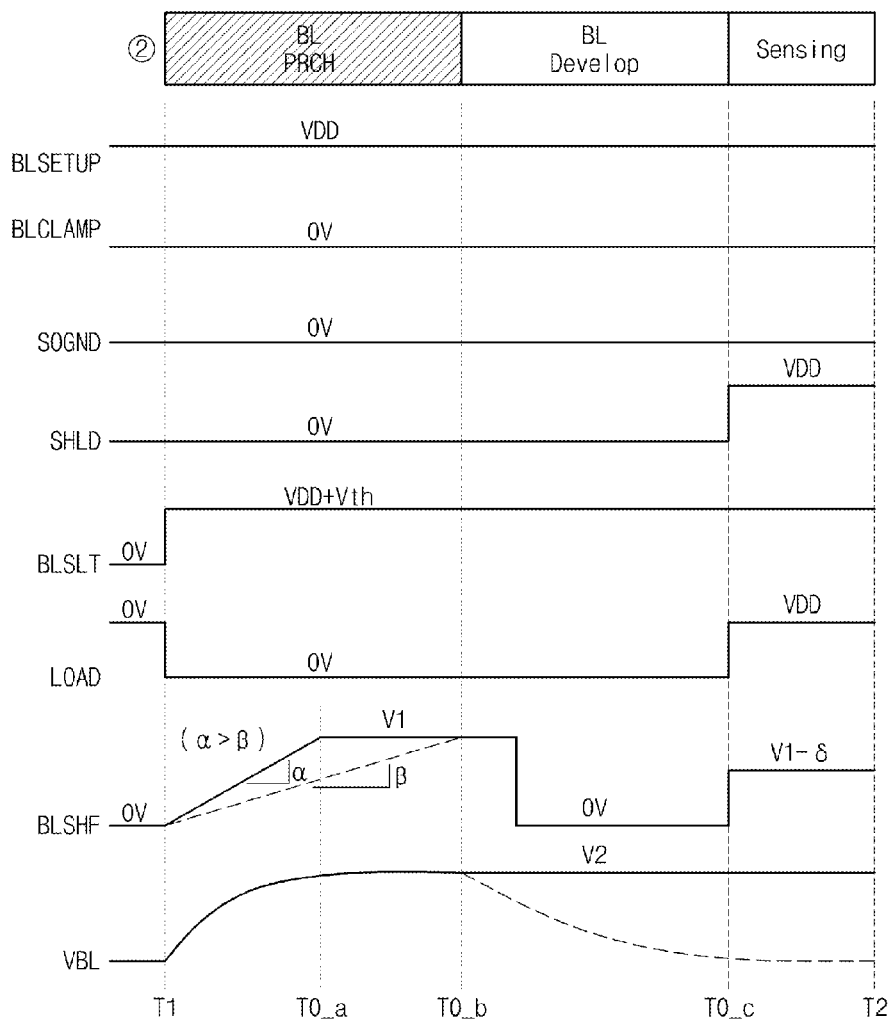
FIG. 6 is a waveform diagram illustrating an operation being performed in a program verification section, according to an embodiment of the inventive concept.

FIG. 6 is a waveform diagram illustrating an operation being performed in the program verification section of FIG. 4, according to an embodiment of the inventive concept.

Referring to FIGS. 3 and 6, a precharge operation of a bitline is described during program verification section PGM VFY. At time T1, a precharge operation (BL PRCH) of a bitline for a program verification read operation begins. To perform a precharge operation of a bitline, control signals BLSETUP and BLSLT are set to a power supply voltage VDD or a voltage VDD+Vth higher than power supply voltage VDD. Control signals BLCLAMP, SOGND and SHLD are set to 0V. Under the state, control signal LOAD is activated to 0V to turn on a load transistor P2. Then, a sensing node S0 rises to power supply voltage VDD. Control signal BLSHF being provided to a gate of select transistor N1 gradually increases. As control signal BLSHF increases, a channel size of select transistor N1 increases. Charges that are charged in sensing node S0 flow into bitline BL0.

In a method for applying control signal BLSHF, a level of control signal BLSHF can rise with a slope α in a specific program loop. Where the level of control signal BLSHF reaches a target level V1, control signal BLSHF does not change any more and is fixed to target level V1. In this case, precharge time of the bitline corresponds to a relatively short section T1~T1_a. Control signal BLSHF rises with a slope β in a loop count (Loop_cnt) in which a relatively large amount of current is consumed. Where control signal BLSHF reaches a target level V1, control signal BLSHF does not change any more and is fixed to target level V1. Where control signal BLSHF rises with a relatively small slope β, time required in a precharge of the bitline corresponds to a relatively long section T1~T1_b.

In this way, an amount of charge that flows into the bitline can be easily controlled by controlling a rising slope of control signal BLSHF. This function means that it can lower a level of a current peak that occurs where a precharge operation of the bitline is performed.

According to a precharge method of a bitline of the inventive concept, a current peak that occurs where a precharge operation of a bitline is performed can be suppressed by controlling an increasing speed or increasing time of control signal BLSHF. Also, a rising slope of control signal BLSHF can be selected according to a loop count (Loop_cnt) or a program pulse level. Through that function described above, control signal BLSHF can be provided which has a relatively small rising slope at a precharge operation of a bitline of a program loop having a relatively large current peak.

At time T1_b, a precharge operation of a bitline is completed and a develop operation of a bitline begins. Select transistor N2 is turned off to perform a develop operation of a bitline. Under that state, charges that are charged in bitline BL0 may be discharged or maintained depending on a program state of a memory cell.

According to the embodiment described in FIG. 6, a precharge speed of a bitline can be controlled with reference to a level of a program pulse. A current peak can more greatly occur in a specific loop depending on a coupling or a threshold voltage change of memory cells. According to a described programming method, a precharge speed of a bitline in the program loop can be controlled to be low. Thus, an amount of charge flowing into a bitline per hour becomes low. That is, where a bitline precharge operation is performed, a level of a current peak can be suppressed.

Figure 7A:
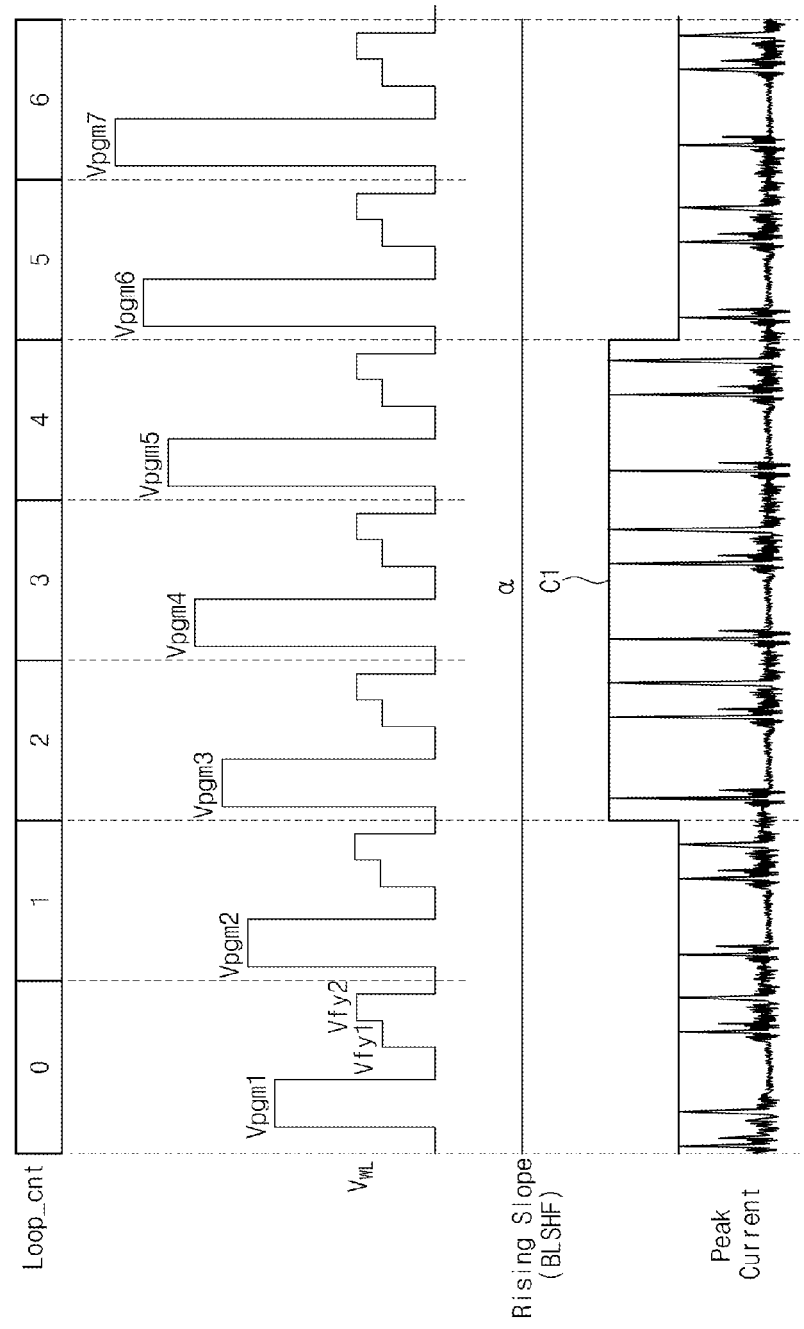
FIGS. 7A and 7B are waveform diagrams for describing an effect of certain embodiments of the inventive concept.
Figure 7B:
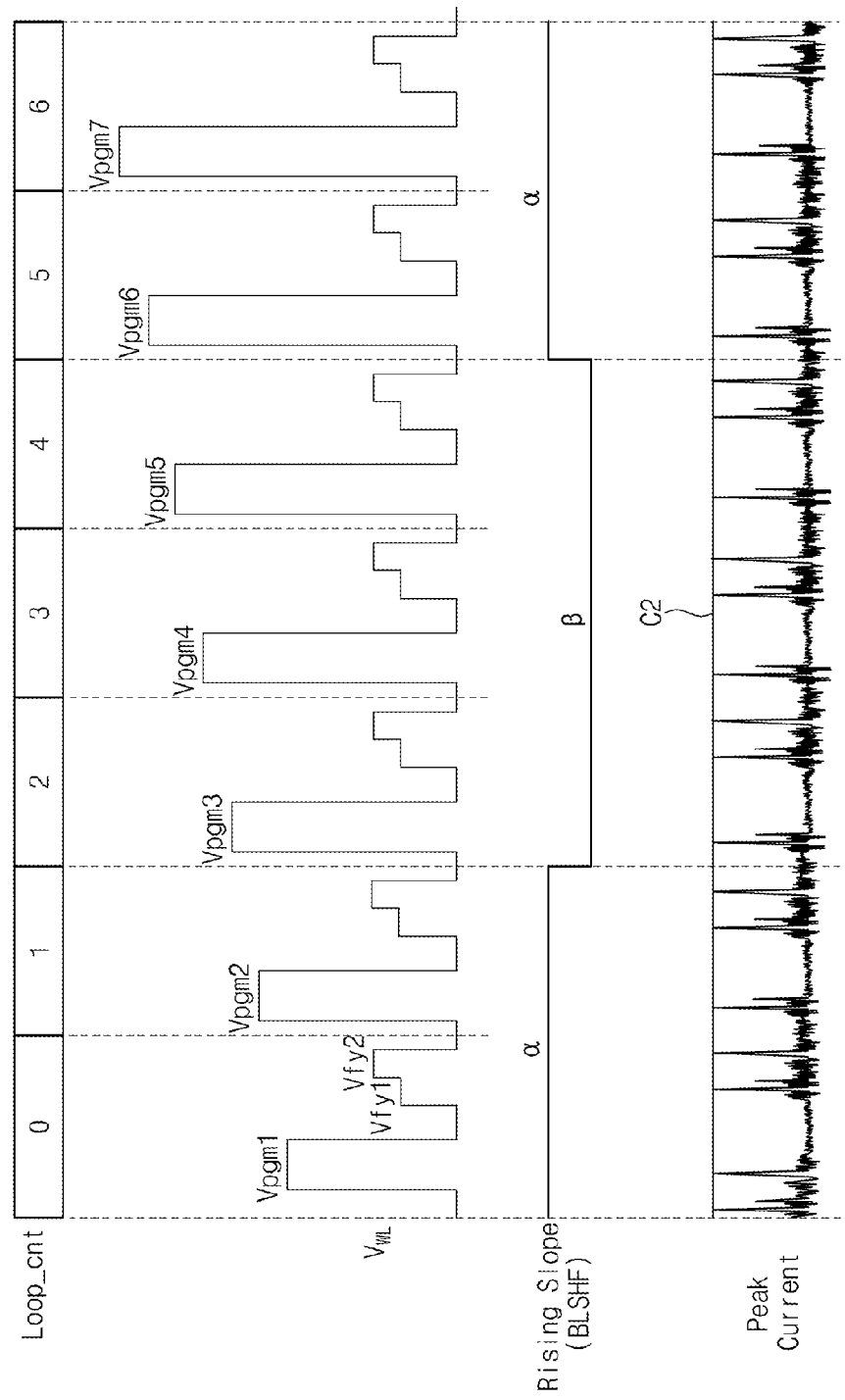

FIGS. 7A and 7B are waveform diagrams for describing an effect of certain embodiments of the inventive concept. FIG. 7A shows a shape of a current peak that occurs where a program operation is performed, and a setup or precharge speed of a bitline is not changed. FIG. 7B shows a shape of a current peak that occurs where a program operation is performed, and a setup or precharge speed of a bitline is changed.

Referring to FIG. 7A, where a program operation is performed, a program voltage VpgmN (N is a natural number) and verifying voltages Vfy1 and Vfy2 are provided. Herein, a level of verifying voltages being provided at every loop can be given three or more but for convenience of description, it will be assumed that two verifying voltages Vfy1 and Vfy2 are provided.

In a program loop corresponding to a loop count '0', program voltage Vpgm1 and verifying voltages Vfy1 and Vfy2 are applied. In program loops loop1, loop2, ..., gradually increasing program voltages Vpgm2, Vpgm3, ..., are applied respectively. In each program loop, a verifying voltage having the same level as the verifying voltage applied to a previous program loop is applied. In each program loop, a setup or precharge operation of a bitline is performed.

Where a program operation is performed, it will be assumed that in a setup or precharge operation of a bitline, a rising slope α of control signal BLSHF which is a gate voltage of select transistor N1 is constant in all loop counts Loop_cnt as illustrated in FIG. 7A. Thus, where a setup speed of a bitline is constant, a level of a current peak may be changed depending on a loop count Loop_cnt or a level of a program pulse being applied. For example, a level of a current peak that occurs in the loop counts loop2, loop3 and loop4 can be greater than a level of a current peak that occurs in the loop count loop0 and loop1. A current peak can be affected by a coupling or the number of memory cells of which a program is completed among the selected memory cells. Thus, a level of a current peak can become different depending on a loop count Loop_cnt. The level of the current peak can be represented by a curve C1 which connects the maximum values of current peaks illustrated in FIG. 7A.

Referring to FIG. 7B, in a setup or precharge operation of a bitline, a rising slope of control signal BLSHF changes depending on a loop count. In loop counts (loop0 and loop1), a rising slope of control signal BLSHF of select transistor N1 is controlled to be α. In loop counts (loop2, loop3 and loop4), a rising slope of control signal BLSHF of select transistor N1 is controlled to be β which is smaller than α. In this case, a setup or precharge speed of a bitline is reduced and an amount of charge flowing into a bitline is reduced. Thus, a level of a current peak is relatively reduced.

Figure 8:
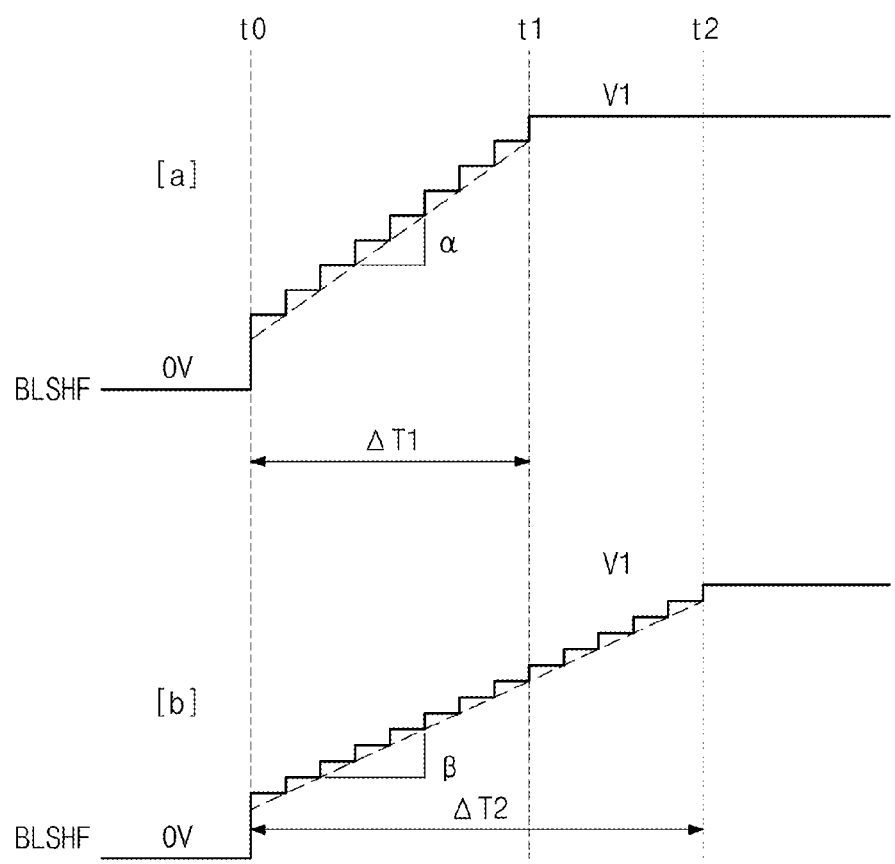
FIG. 8 is a waveform diagram illustrating a control signal being provided to a bitline select transistor, according to an embodiment of the inventive concept.

FIG. 8 is a waveform diagram illustrating a control signal being provided to a bitline select transistor.

Referring to FIG. 8, a waveform of control signal BLSHF being provided to a gate of select transistor N1 is illustrated.

Referring to a waveform diagram [a], control signal BLSHF rises with a slope α. control signal BLSHF begins to rise at time t0 and reaches a target voltage V1 at time t1. That is, control signal BLSHF rises with a slope α with respect to time it takes for control signal BLSHF to reach target voltage V1. The time it takes for control signal BLSHF to reach target voltage V1 corresponds to ΔT1.

Referring to a waveform diagram [b], control signal BLSHF begins to rise at time t0 and reaches a target voltage V1 at time t2. That is, control signal BLSHF rises with a slope Δ. The time it takes for control signal BLSHF to reach target voltage V1 corresponds to ΔT2. The rising slope β is small compared to the rising slope α. Thus, an amount of charge flowing into a channel of select transistor N1 is more reduced Where control signal BLSHF is controlled to have a rising slope β compared to the case that control signal BLSHF is controlled to have a rising slope α. Thus, a level of a current peak can be controlled by controlling a slope or setup time of control signal BLSHF.

Figure 9:
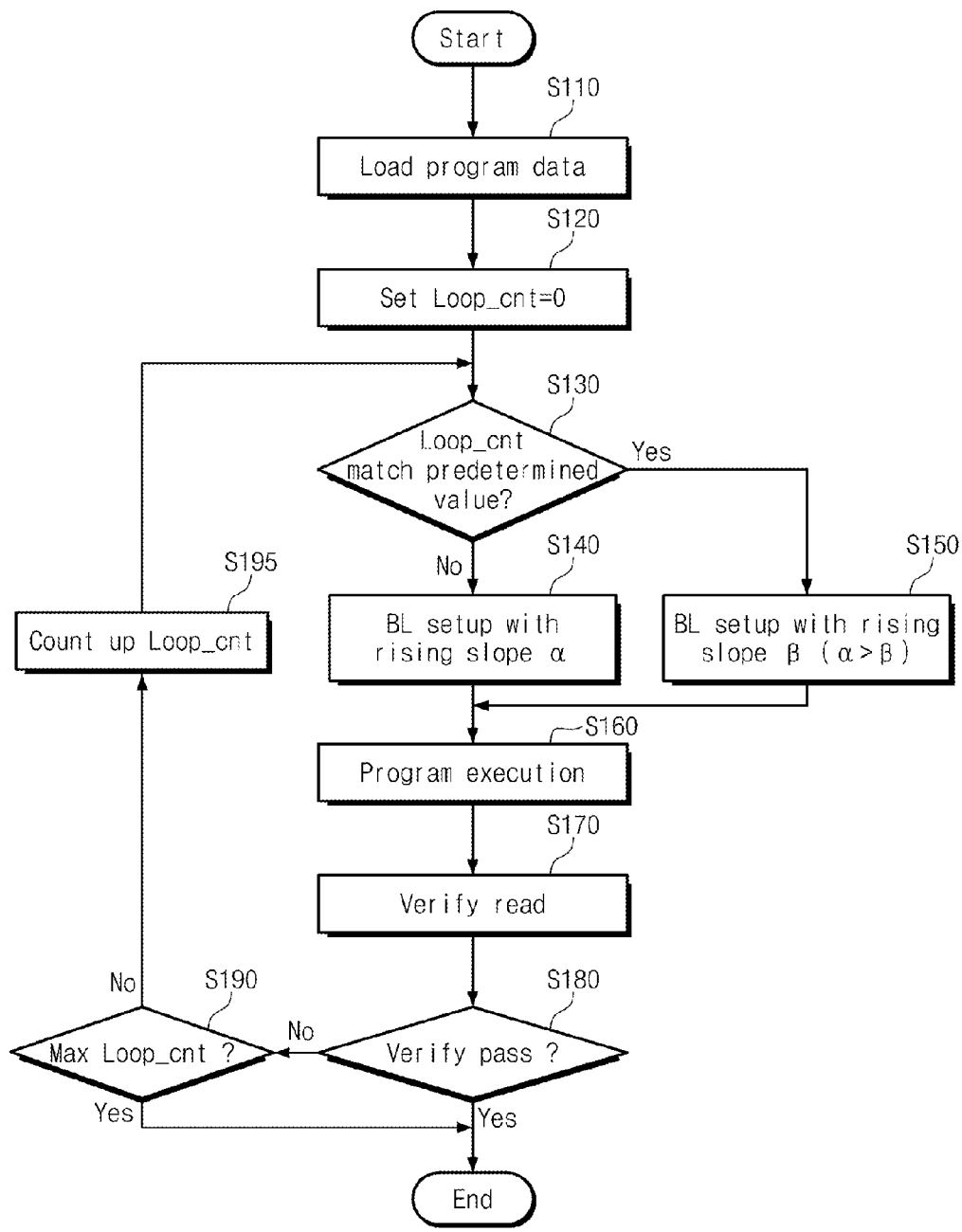
FIG. 9 is a flowchart illustrating a programming method of a nonvolatile memory device according to an embodiment of the inventive concept.

FIG. 9 is a flowchart illustrating a programming method of a nonvolatile memory device according to an embodiment of the inventive concept.

Referring to FIG. 9, where a program operation is performed, a level of a current peak can be controlled by changing a slope or setup speed of a bitline according to a loop count. In a step S110, data input in selected memory cells is loaded. For example, write data is loaded in data latches in page buffer 130.

In a step S120, a loop count is initialized. A value of the initialized loop count is '0'. In a step S130, it is detected whether a loop count satisfies a specific condition. For example, a range of a loop count can be detected. For instant, it can be detected whether a loop count is within a range (L≤Loop_cnt<M, L and M are a natural number). Where a loop count being counted is not within the range (L≤Loop_cnt<M), the procedure continues to a step S140. Where a loop count being counted is within the range (L≤Loop_cnt<M), the procedure continues to a step S150. Herein, the case that a range of the loop count is greater than L and smaller than M is given as an example but the inventive concept is not limited thereto. That is, it can be detected whether a range of the loop count is greater than a specific number or smaller than a specific number.

In step S140, to set up a bitline, control logic 140 makes control signal BLSHF being provided to a gate of select transistor N1 have a rising slope α. Thus, an amount of charge being provided to a bitline relatively increases.

In step S150, to set up a bitline, control logic 140 makes control signal BLSHF being provided to a gate of select transistor N1 have a rising slope β. The rising slope α is small compared to the rising slope β. Thus, a channel size of select transistor N1 extends relatively slowly and an amount of charge being provided to a bitline becomes relatively small. Thus, even though a current peak occurs, a level of a current peak is limited by a limited channel width of select transistor N1.

In a step S160, a program pulse (e.g., Vpgm) is applied to a wordline of selected memory cells. The selected memory cells are connected to a same wordline and may be formed of multi level cells.

In a step S170, a verification-read operation is executed on the selected memory cells. Verifying voltages Vfy1, Vfy2, . . . . are provided to a wordline of the selected memory cells to execute a verification-read operation on a target state. Even in a verification-read operation, a bitline has to be precharged. To precharge a bitline, a rising slope of control signal BLSHF being provided to a gate of select transistor N1 can be controlled.

In a step S180, an operation division occurs depending on a verification-read result of the selected memory cells. That is, if the selected memory cells are all off-cells, the program procedure ends (Yes direction). If on-cells exist among the selected memory cells, the program operation is judged as being failed (No direction). The procedure continues to a step S190.

In step S190, control logic 140 detects whether a loop count (Loop_cnt) reaches the maximum value (Max Loop_cnt). Where the loop count (Loop_cnt) reaches the maximum value (Max Loop_cnt), the procedure unconditionally ends. Where the loop count (Loop_cnt) does not reach the maximum value (Max Loop_cnt), the procedure continues to a step S195.

In step S195, the loop count (Loop_cnt) is counted up. And then the procedure returns to step S130 for executing a program operation corresponding to an increased loop count.

An embodiment that a rising slope of control signal BLSHF is changed according to the loop count (Loop_cnt) value was described. According to the embodiment, in a specific loop count (Loop_cnt), a rising slope of control signal BLSHF for setting up or precharging a bitline may be reduced. Thus, a level of a current peak that occurs where a program operation corresponding to the specific loop count (Loop_cnt) is performed can be easily controlled.

Figure 10:
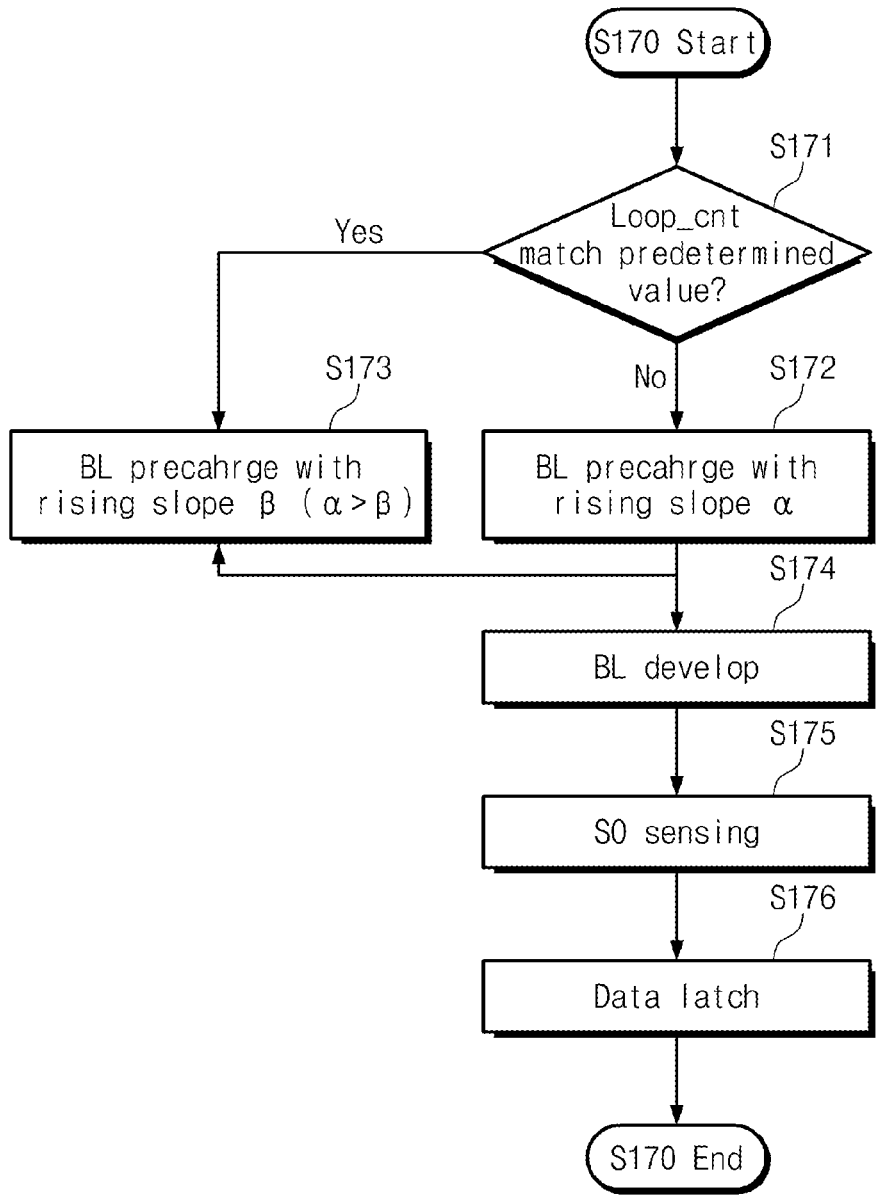
FIG. 10 is a flowchart illustrating a verification read operation of FIG. 9, according to an embodiment of the inventive concept.

FIG. 10 is a flowchart illustrating a verification-read operation of FIG. 9, according to an embodiment of the inventive concept. Step 170 of FIG. 9 corresponding to a verification-read operation is described in detail with reference to FIG. 10.

In a step S171, it is detected whether a loop count (Loop_cnt) satisfies a specific condition. For instant, a range of a current loop count (Loop_cnt) can be detected. It can be detected whether the current loop count (Loop_cnt) is within a range (L≤Loop_cnt<M, L and M are a natural number) in which a relatively great current peak occurs. If the loop count (Loop_cnt) is not within the range (L≤Loop_cnt<M), the procedure continues to a step S172. If the loop count (Loop_cnt) is within the range (L≤Loop_cnt<M), the procedure continues to a step S173.

In step S172, to precharge a bitline, control logic 140 makes control signal BLSHF being provided to a gate of select transistor N1 have a rising slope α. Thus, an amount of charge being provided to a bitline relatively increases.

In step S173, to precharge a bitline, control logic 140 makes control signal BLSHF being provided to a gate of select transistor N1 have a rising slope β. The rising slope α is small compared to the rising slope β. Thus, a channel size of select transistor N1 extends relatively slowly and an amount of charge being provided to a bitline becomes relatively small. Thus, even though a current peak occurs, a level of a current peak is limited by a limited channel width of select transistor N1.

In a step S174, an amount of charge applied to a bitline can be changed depending on an on/off state of the selected memory cell. This operation is called a bitline development.

In a step S175, a detection operation is executed on a voltage level of a bitline changed by the bitline development. An amount of charge or voltage of the developed bitline is transmitted to a sensing node S0.

In a step S176, a level of sensing node S0 is stored in a sensing latch 131 in a page buffer PB0 (refer to FIG. 3). Data stored in sensing latch 131 is output to an external destination and is used as a basis for judging whether a program operation is completed (pass/fail).

A control method of a precharge speed of a bitline being performed where a verification-read operation is performed was described. A precharge speed of a bitline can be determined with reference to a loop count (Loop_cnt). In a specific loop count (Loop_cnt), a rising slope of control signal BLSHF for precharging a bitline can be relatively reduced. Thus, a level of a current peak that occurs where a program verification operation of the specific loop count (Loop_cnt) is performed can be easily controlled.

Figure 11:
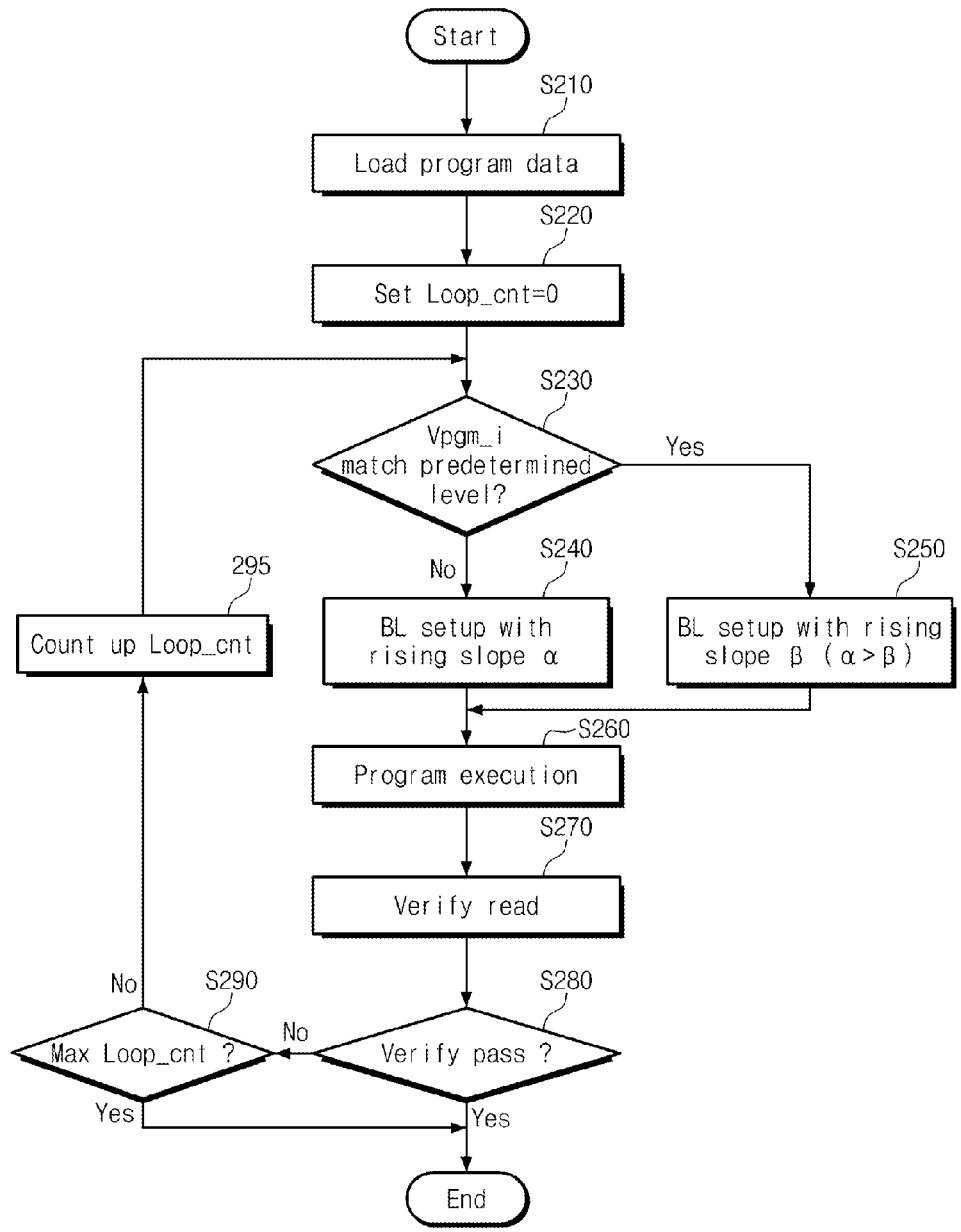
FIG. 11 is a flowchart illustrating a programming method for a nonvolatile memory device according to an embodiment of the inventive concept.

FIG. 11 is a flowchart illustrating a programming method of a nonvolatile memory device in accordance with an embodiment of the inventive concept.

Referring to FIG. 11, a setup speed or slope of a bitline can be changed according a program pulse level.

In a step S210, data input in selected memory cells is loaded. For example, write data is loaded in data latches in page buffer 130. In a step S220, a loop count is initialized. A value of the initialized loop count is '0'.

In a step S230, it is detected whether a level of a program pulse Vpgm_i to be provided to a wordline of selected memory cells corresponds to a specific condition. For example, it can be detected whether a level of a program pulse is within a range (Va≤Vpgm_i<Vb) in which a level of a current peak increases. Where a level of a program pulse is not within the range (Va≤Vpgm_i<Vb), the procedure continues to a step S240. Where a level of a program pulse is within the range (Va≤Vpgm_i<Vb), the procedure continues to a step S250. Herein, the range (Va≤Vpgm_i<Vb) of program pulse Vpgm_i is only an illustration. Various ranges of program pulse Vpgm_i can be determined depending on a device characteristic.

In step S240, to set up a bitline, control logic 140 makes control signal BLSHF being provided to a gate of select transistor N1 have a rising slope α.

In step S250, to set up a bitline, control logic 140 makes control signal BLSHF being provided to a gate of select transistor N1 have a rising slope β. The rising slope α is small compared to the rising slope β. Thus, a channel size of select transistor N1 extends relatively slowly and an amount of charge being provided to a bitline becomes relatively small. Thus, even though a current peak occurs, a level of a current peak is limited by a limited channel width of select transistor N1.

In a step S260, a program pulse (e.g., Vpgm) is applied to a wordline of selected memory cells. In a step S270, a verification-read operation is executed on the selected memory cells. Verifying voltages Vfy1, Vfy2, . . . are provided to a wordline of the selected memory cells to execute a verification-read operation on a target state. Even in a verification-read operation, a bitline has to be precharged. To precharge a bitline, a rising slope of control signal BLSHF being provided to a gate of select transistor N1 can be controlled.

In a step S280, an operation division occurs depending on a verification-read result of the selected memory cells. That is, if the selected memory cells are all off-cells, the program procedure ends. If on-cells exist among the selected memory cells, the program operation is judged as being failed. The procedure continues to a step S290.

In step S290, control logic 140 detects whether a loop count (Loop_cnt) reaches the maximum value (Max Loop_cnt). If the loop count (Loop_cnt) reaches the maximum value (Max Loop_cnt), the procedure unconditionally ends. If the loop count (Loop_cnt) does not reach the maximum value (Max Loop_cnt), the procedure continues to a step S195. In step S295, the loop count (Loop_cnt) is counted up. And then the procedure returns to step S130 for executing a program operation corresponding to an increased loop count.

An embodiment that a rising slope of control signal BLSHF is changed according to a level of program pulse level Vpgm_i was described. According to the embodiment, in a specific program pulse level Vpgm_i, a rising slope of control signal BLSHF for setting up or precharging a bitline may be reduced. Thus, a level of a current peak that occurs where a program operation corresponding to program pulse level Vpgm_i is performed can be easily controlled.

Figure 12:
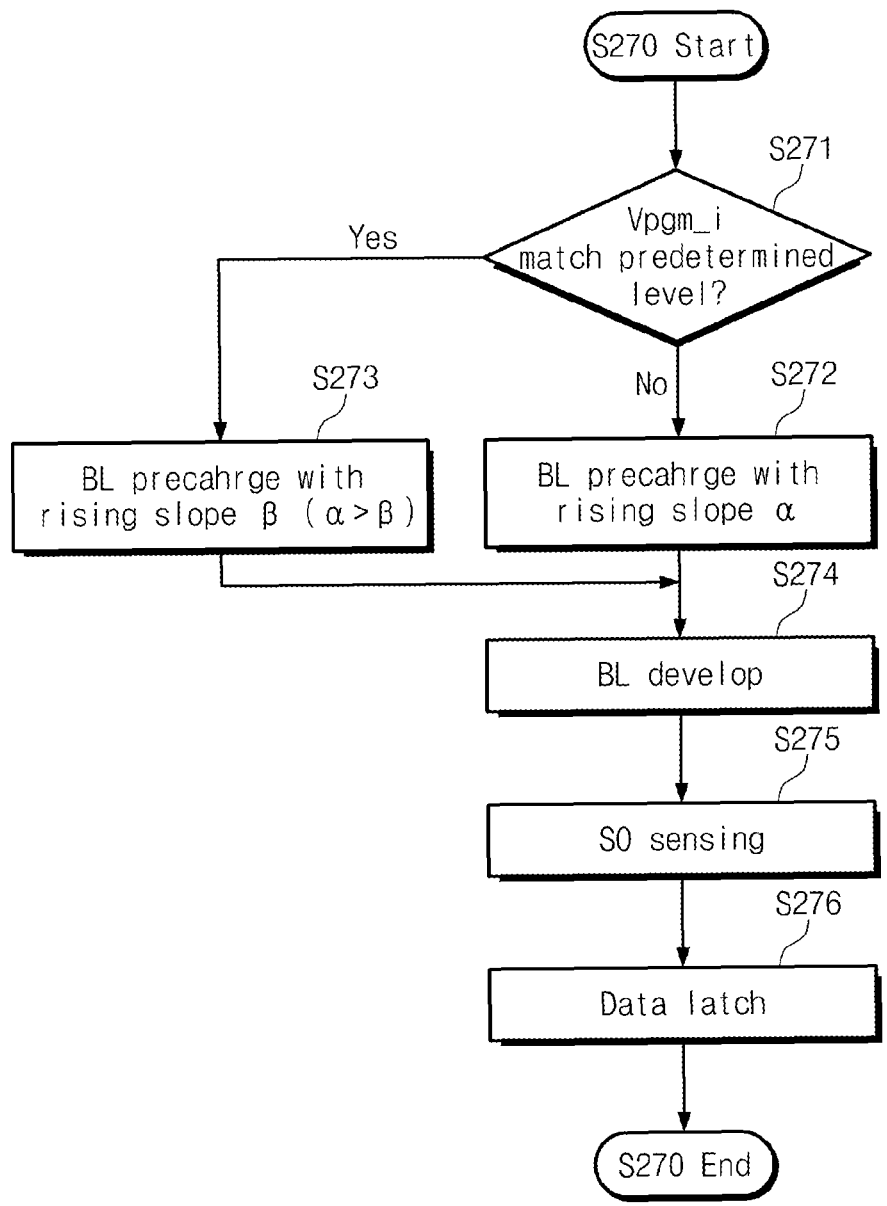
FIG. 12 is a flowchart illustrating a verification read operation of FIG. 11, according to an embodiment of the inventive concept.

FIG. 12 is a flowchart illustrating a verification read operation of FIG. 11, according to an embodiment of the inventive concept. Step S270 of FIG. 11, which corresponds to a verification-read operation, is described in detail with reference to FIG. 12.

In a step S271, it is detected whether a program pulse level Vpgm_i to be provided to a wordline of selected memory cells satisfies a specific condition. For example, it can be detected whether program pulse level Vpgm_i is within a range (Va≤Vpgm_i<Vb) in which a level of a current peak increases. If program pulse level Vpgm_i is not within the range (Va≤Vpgm_i<Vb), the procedure continues to a step S272. If program pulse level Vpgm_i is within the range (Va≤Vpgm_i<Vb), the procedure continues to a step S273.

In step S272, to precharge a bitline, control logic 140 makes control signal BLSHF being provided to a gate of select transistor N1 have a rising slope α.

In step S273, to precharge a bitline, control logic 140 makes control signal BLSHF being provided to a gate of select transistor N1 have a rising slope β. The rising slope α is small compared to the rising slope β. Thus, a channel size of select transistor N1 extends relatively slowly and an amount of charge being provided to a bitline becomes relatively small. Thus, even though a current peak occurs, a level of a current peak is limited by a limited channel width of select transistor N1.

In a step S274, an amount of charge applied to a bitline can be changed depending on an on/off state of the selected memory cell. This operation is called a bitline development. In a step S275, a detection operation is performed on a voltage level of a bitline changed by the bitline development. An amount of charge or voltage of the developed bitline is transmitted to a sensing node S0.

In a step S276, a level of sensing node S0 is stored in a sensing latch 131 in a page buffer PB0 (refer to FIG. 3). Data stored in sensing latch 131 is output to an external destination and is used as a basis to judge whether a program operation is completed or not (pass/fail).

The above description presents a control method of a precharge speed of a bitline being performed where a verification-read operation is performed. A precharge speed of a bitline can be determined by program pulse level Vpgm_i. In a specific program pulse level Vpgm_i, a rising slope of control signal BLSHF for precharging a bitline can be reduced. Thus, a level of a current peak that occurs where a program verification-read operation corresponding to the specific program pulse level Vpgm_i is performed can be easily controlled.

Figure 13:
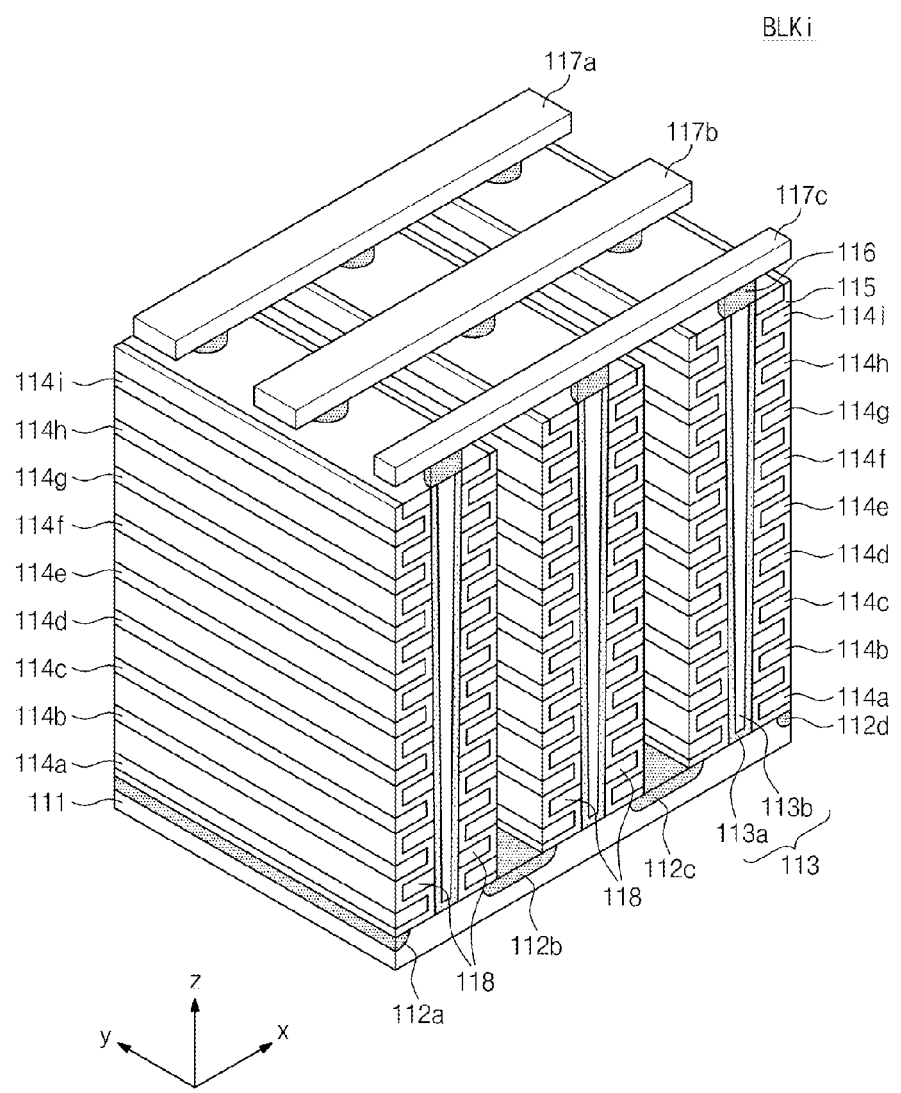
FIG. 13 is a perspective view illustrating a memory block BLKi in a cell array of FIG. 1, according to an embodiment of the inventive concept.

FIG. 13 is a perspective view illustrating a memory block BLKi constituting a cell array of FIG. 1, according to an embodiment of the inventive concept.

Referring to FIG. 13, memory block BLKi comprises structures extending along a plurality of directions (x, y, z).

To form memory block BLKi, a substrate 111 is formed first. Substrate 111 can be formed of a P-well which is formed by implanting elements of fifth group therein. Also, substrate 111 can be formed of a pocket P-well being provided into an N-well. In the following description, it will be assumed that substrate 111 is a P-well. However, substrate 111 is not limited to a P-well.

On substrate 111, a plurality of first through fourth doping areas 112a, 112b, 112c and 112d is formed. The first through fourth doping areas 112a, 112b, 112c and 112d can be formed of a conductive material of n-type different from substrate 111. In the following description, it will be assumed that the first through fourth doping areas 112a, 112b, 112c and 112d have an n-type. However, a type of the first through fourth doping areas 112a, 112b, 112c and 112d is not limited to an n-type.

A plurality of insulating materials 118 extending along a y direction are sequentially provided on substrate 111 between the first and second doping areas 112a and 112b along a z direction. Insulating materials 118 are formed to be spaced a predetermined distance apart from one another along the z direction. Insulating material 118 comprises an insulating material like silicon oxide.

A pillar 113 is formed which is sequentially disposed on substrate 111 between the first and second doping areas 112a and 112b along the y direction and penetrates insulating materials 118 along the z direction. Pillar 113 penetrates insulating materials 118 to be connected to substrate 111. Pillar 113 is also formed on substrate 111 between the second and third doping areas 112b and 112c and between the third and fourth doping areas 112c and 112d.

Pillar 113 is formed of a plurality of materials. For example, a surface layer 113a of pillar 113 comprises silicon material having a first type. Surface layer 113a of pillar 113 comprises silicon material having the same type as substrate 111. In the following description, it will be assumed that surface layer 113a of pillar 113 comprises P-type silicon. However, surface layer 113a of pillar 113 is not limited to include P-type silicon. An internal layer 113b of pillar 113 is formed of insulating material. For example, internal layer 113b of pillar 113 comprises insulating material like silicon oxide.

An insulating layer 115 is formed along insulating materials 118, pillar 113 and an exposed surface of substrate 111 on an area between the first and second doping areas 112a and 112b. An insulating layer 125 being provided on an exposed surface of the z direction of last insulating material 118 being provided along the z direction can be removed.

First conductive materials 114a~114i are formed on an exposed surface of insulating layer 115 on an area between the first and second doping areas 112a and 112b. For example, a first conductive material 114a extending along the y direction is formed between substrate 111 and the insulating material adjacent to substrate 111. More specifically, first conductive material 114a extending in the y direction is formed between substrate 111 and insulating layer 115 of a bottom surface of insulating material 118 adjacent to substrate 111.

A structure which is the same as the structure on the first and second doping areas 112a and 112b is provided on an area between the second and third doping areas 112b and 112c. A structure which is the same as the structure on the first and second doping areas 112a and 112b is provided on an area between the third and fourth doping areas 112c and 112d.

Drains 116 are provided on pillars 113 respectively. Drains 116 may be silicon material doped with a second type. For example, drains 116 are silicon materials doped with an n-type. In the following description, it will be assumed that drains 116 include n-type silicon. However, drains 116 are not limited to include n-type silicon.

Second conductive materials 117a-117c extending in the x direction are provided on drains 116. Second conductive materials 117a-117c are sequentially disposed along the y direction. Each of second conductive materials 117a-117c is connected to corresponding drains 116. Each of the second conductive material and corresponding drains 116 are connected to each other through contact plugs.

First conductive materials 114a~114i form wordlines and select lines SSL and GSL. The first conductive materials that belong to a same layer among first conductive materials 114b~114h forming wordlines are connected to one another. Memory block BLKi can be selected where all first conductive materials 114a~114i are selected. A sub-block of the inventive concept can be selected where a part of first conductive materials 114a~114i is selected. The number of layers of first conductive materials 114a~114i is only an illustration. The number of layers of first conductive materials 114a~114i may be changed depending on a process technology or a control technology.

Figure 14:
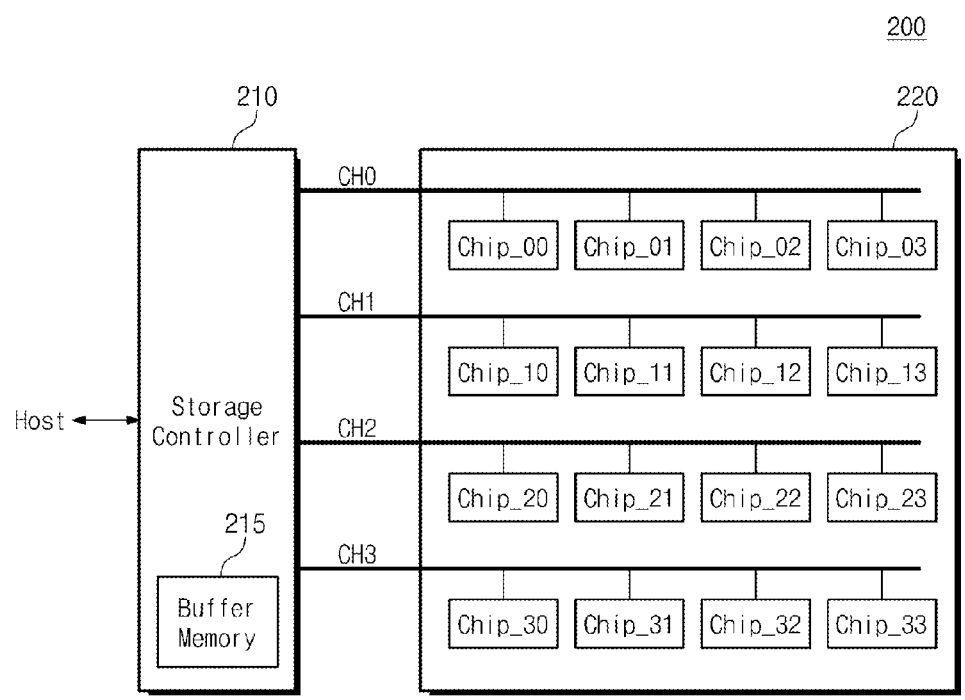
FIG. 14 is a block diagram illustrating a storage device in accordance with an embodiment of the inventive concept.

FIG. 14 is a block diagram illustrating a storage device in accordance with an embodiment of the inventive concept.

Referring to FIG. 14, a storage device 200 comprises a storage controller 210 and a nonvolatile memory device 220 comprising multi chip package exchanging data through a plurality of channels CH0, CH1, ..., CH3. An input/output port (e.g., 8-bit I/O port) of each of memory chips chip_00~chip_03 is connected to first channel CH0. In the same manner, each of channels CH1 through CH3 shares input/output ports of memory chips.

Where programming data in nonvolatile memory device 220, storage device 210 can select the memory chips chip00~chip33 by a channel unit or a way unit (the way means memory devices being selected from each channel at the same time). Each of the memory chips chip00~chip33 can control a setup or precharge speed of a bitline according to a program loop or a program voltage level. Through that operation, the whole current peak that occurs at each of the memory chips chip00~chip33 of nonvolatile memory device 220 can be greatly suppressed.

Figure 15:
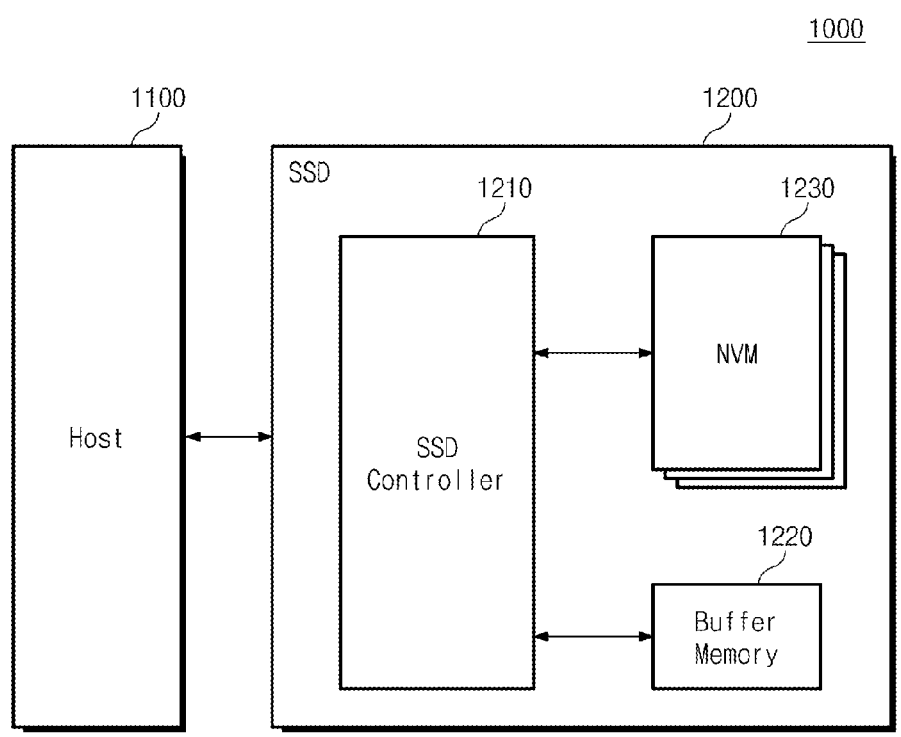
FIG. 15 is a block diagram illustrating a user device comprising a solid state disk (SSD) according to an embodiment of the inventive concept.

FIG. 15 is a block diagram illustrating a user device comprising a solid state disk (SSD) according to an embodiment of the inventive concept.

Referring to FIG. 15, a user device 1000 comprises a host 1100 and a SSD 1200. SSD 1200 comprises a SSD controller 1210, a buffer memory 1220 and a nonvolatile memory device 1230.

SSD controller 1210 provides a physical connection between host 1100 and SSD 1200. That is, SSD controller 1210 corresponds to a bus format of host 1100 to provide an interface with SSD 1200. SSD controller 1210 decodes a command being provided from host 1100. According to a decoding result, SSD controller 1210 accesses nonvolatile memory device 1230. Examples of the bus format of host 1100 may include a universal serial bus (USB), a small computer system interface (SCSI), a PCI express, an ATA, a parallel ATA (PATA), a serial ATA (SATA), a serial attached SCSI (SAS), etc.

Buffer memory 1220 temporarily stores data being provided from host 1100 or data being read from nonvolatile memory device 1230. If data that exists in nonvolatile memory device 1230 is cached where a read request of host 1100 occurs, buffer memory 1220 supports a cache function of directly providing cached data to host 1100. Generally, a data transmission speed by a bus format (e.g., SATA or SAS) of host 1100 is much faster than a transmission speed of a memory channel of SSD 1200. Where an interface speed of host 1100 is greatly high, performance degradation caused by a speed difference can be minimized by providing a large capacity buffer memory 1220.

Nonvolatile memory device 1230 is provided as a storage medium of SSD 1200. For example, nonvolatile memory device 1230 can be provided as a NAND-type flash memory having a high storage capacity. Nonvolatile memory device 1230 may include a plurality of memory devices. In this case, each of the memory devices is connected to SSD controller 1210 by a channel unit. Nonvolatile memory device 1230 can control a setup or precharge speed of a bitline according to a program loop or a program pulse level. Through that operation, a level of a current peak that occurs at nonvolatile memory device 1230 can be greatly suppressed.

A NAND-type flash memory has been presented as a storage medium of nonvolatile memory device 1230 for explanation purposes, but other nonvolatile memory devices can be provided as a storage medium of nonvolatile memory device 1230 in alternative embodiments. For example, a PRAM, a MRAM, a ReRAM, a FRAM, a NOR flash memory, or combinations thereof can be used as a storage medium. Nonvolatile memory device 1230 comprises a buffer area for a buffer program operation and a main area for a main program operation.

Figure 16:
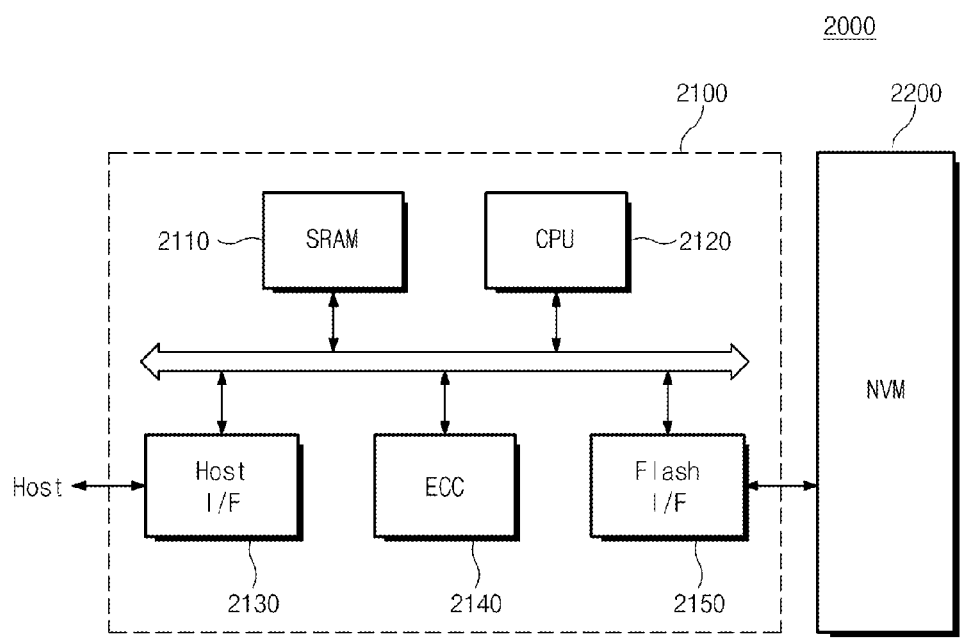
FIG. 16 is a block diagram illustrating a memory system in accordance with an embodiment of the inventive concept.

FIG. 16 is a block diagram illustrating a memory system in accordance with an embodiment of the inventive concept.

Referring to FIG. 16, a memory system 2000 comprises a memory controller 2100 and a nonvolatile memory device 2200.

Nonvolatile memory device 2200 can be formed the same as nonvolatile memory device 100 of FIG. 1. Nonvolatile memory device 2200 controls a setup or precharge speed of a bitline according to a program loop or a program voltage level. Through that operation, a level of a current peak that occurs at nonvolatile memory device 2200 can be greatly suppressed.

Memory controller 2100 can be configured to control nonvolatile memory device 2200. A SRAM 2110 can be used as a working memory of a CPU 2120. A host interface 2130 can include data exchange protocols of a host being connected to memory system 2000. An error correction circuit 2140 in memory controller 2100 can detect and correct errors in data being read from nonvolatile memory device 2200. A memory interface 2150 can interface with nonvolatile memory device 2200. CPU 2120 can perform the whole operation for data exchange of memory controller 2100. Although not illustrated in FIG. 16, memory system 2000 can further include a ROM that stores code data for interface with the host.

Memory controller 2100 communicates with an external device (e.g., host) through one of various interface protocols such as USB, MMC, PCI-E, SAS, PATA, SCSI, ESDI and IDE.

Memory system 2000 can be applied to one of various user devices such as a computer, an ultra mobile PC (UMPC), a workstation, a net-book, a personal digital assistants (PDA), a portable computer, a web tablet, a tablet computer, a wireless phone, a mobile phone, a smart phone, a digital camera, a digital audio recorder, a digital audio player, a digital picture recorder, a digital picture player, a digital video recorder, a digital video player, a device that can transmit and receive information in a wireless environment and one of various electronic devices constituting a home network.

Figure 17:
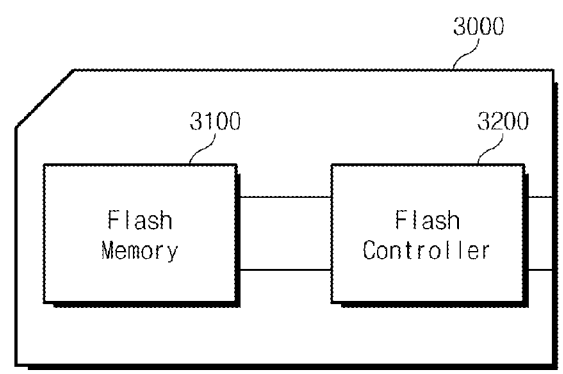
FIG. 17 is a block diagram illustrating a data storage device in accordance with an embodiment of the inventive concept.

FIG. 17 is a block diagram illustrating a data storage device in accordance with an embodiment of the inventive concept.

Referring to FIG. 17, a data storage device 3000 may include a flash memory chip 3100 and a flash controller 3200. Flash controller 3200 can control flash memory chip 3100 on the basis of control signals received from the outside of data storage device 3000.

Flash memory chip 3100 is constituted to be the same as nonvolatile memory device 100 of FIG. 1 and may be constituted by a multi chip. Flash memory chip 3100 can be constituted by one of a stack flash structure in which arrays are stacked having a multilayered array, a flash structure without a source-drain, a pin-type flash structure and a three-dimensional flash structure. Flash memory chip 3100 controls a setup or precharge speed of a bitline according to a program loop or a program pulse level. Through that operation, a level of a current peak that occurs at flash memory chip 3100 can be greatly suppressed.

Data storage device 3000 can constitute a memory card device, a SSD device, a multimedia card device, an SD device, a memory stick device, a hard disk drive device, a hybrid drive device, or a general-purpose serial bus flash device. For example, data storage device 3000 can constitute a card satisfying industrial standards for using a user device such as a digital camera, a personal computer, etc.

Figure 18:
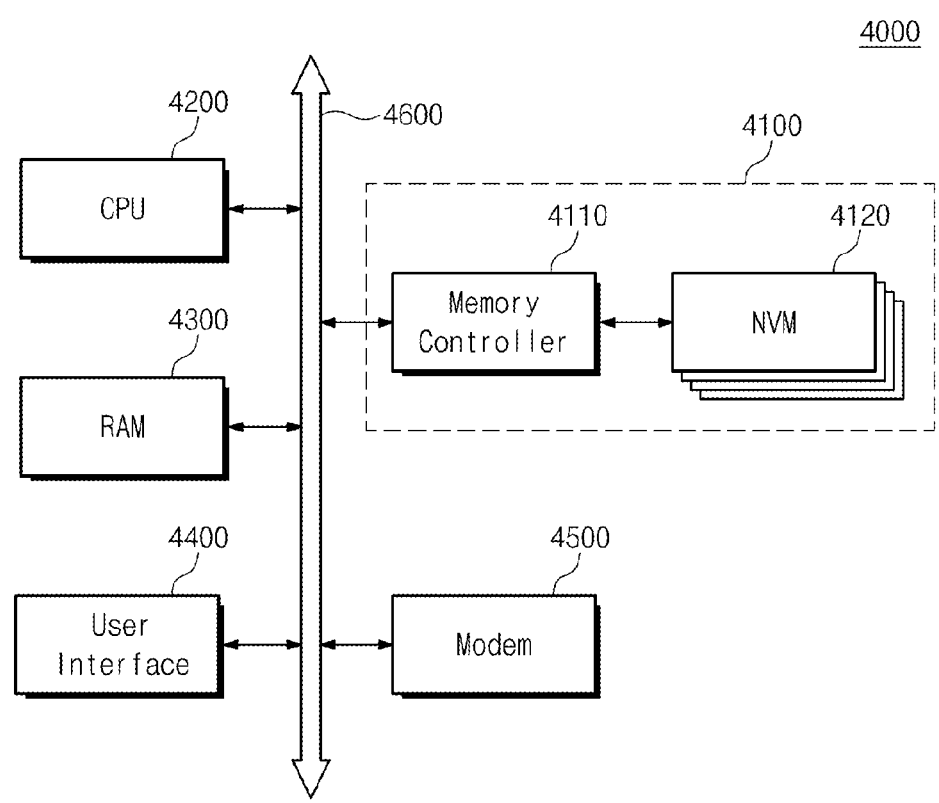
FIG. 18 is a drawing illustrating a storage device and a computing system comprising the storage device according to an embodiment of the inventive concept.

FIG. 18 is a drawing illustrating a storage device and a computing system comprising the storage device according to an embodiment of the inventive concept.

Referring to FIG. 18, a computing system 4000 comprises a storage device 4100, a microprocessor 4200, a RAM 4300, a user interface 4400, a modem 4500 like a baseband chipset that are electrically connected to a bus 4600.

A nonvolatile memory device 4120 in storage device 4100 is constituted to be the same as storage device 100 illustrated in FIG. 1. Nonvolatile memory device 4120 can control a setup or precharge speed of a bitline according to a program loop or a program pulse level. Through that operation, a level of a current peak that occurs at nonvolatile memory device 4120 can be greatly suppressed. Nonvolatile memory device 4120 can be constituted by one of a stack flash structure having a multilayered array, a flash structure without a source-drain, a pin-type flash structure and a three-dimensional flash structure.

Where the computing system is a mobile device, a battery for supplying an operation voltage of the computing system can be additionally provided. Although not illustrated in the drawing, the computing system can further include an application chipset, a camera image processor and a mobile DRAM. Memory controller 4110 and flash memory device 4120 can constitute a solid state drive (SSD) using a nonvolatile memory when storing data.

Figure 19:
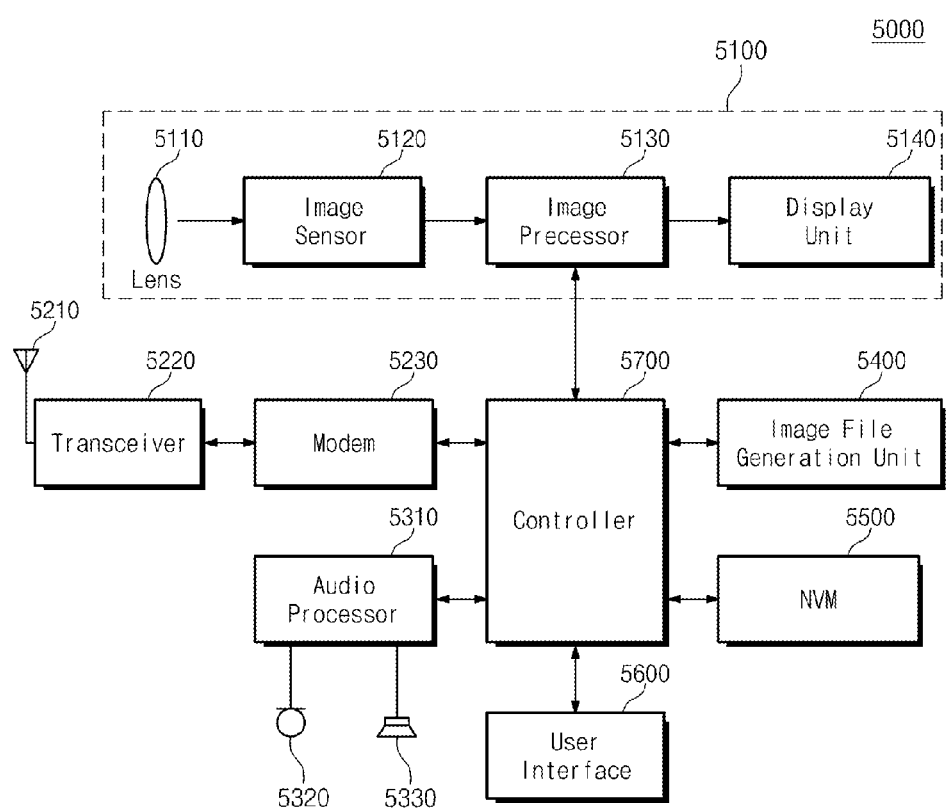
FIG. 19 is a block diagram illustrating a portable terminal according to an embodiment of the inventive concept.

FIG. 19 is a block diagram illustrating a portable terminal according to an embodiment of the inventive concept.

Referring to FIG. 19, a portable terminal 5000 comprises an image processing unit 5100, a wireless transmit/receive unit 5200, an audio processing unit 5300, an image file generation unit 5400, a nonvolatile memory device 5500, a user interface 5600 and a controller 5700.

Image processing unit 5100 comprises a lens 5110, an image sensor 5120, an image processor 5130 and a display unit 5140. An antenna 5210, a transceiver 5220 and a modem 5230 constitutes the wireless transmit/receive unit 5200. An audio processor 5310, a mike 5320 and a speaker 5330 constitutes audio processing unit 5300.

Nonvolatile memory device 5500 can be provided by the nonvolatile memory device being driven according to some embodiments of the inventive concept. In this case, nonvolatile memory device 5500 can control a setup or precharge speed of a bitline according to a program loop or a program pulse level. Through that operation, a level of a current peak that occurs at nonvolatile memory device 5500 can be greatly suppressed.

The nonvolatile memory device and/or the memory controller in accordance with the inventive concept can be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP) and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A method of programming a memory cell of a nonvolatile memory device by executing a plurality of program loops, the method comprising:
   detecting whether a loop count or a level of a program pulse to be applied to the memory cell is within a specific range, wherein the specific range is an operation section in which a level of a current peak flowing into the bitline increases up to a reference value or more;
   charging a bitline of the memory cell at a first charging speed or a second charging speed slower than the first charging speed according to a result of the detection; and
   applying the program pulse to a wordline of the memory cell.

2. The method of claim 1, wherein when the loop count or the level of the program pulse to be applied to the memory cell is within the specific range, the bitline is charged at the second charging speed.

3. The method of claim 1, wherein a selection of the first charging speed and the second charging speed corresponds to a selection of a rising slope size of a control signal BLSHF being provided to a gate of a selection transistor N1 supplying a setup voltage to the bitline.

4. The method of claim 3, wherein the first charging speed or the second charging speed is selected by controlling a time taken for the control signal to reach a target level.

5. The method of claim 1, further comprising:
   detecting whether the loop count or the level of the program pulse is within the specific range;
   charging the bitline at a third charging speed or a fourth charging speed slower than the third charging speed according to the detecting result; and
   applying a program verifying pulse to the wordline.

6. The method of claim 5, wherein a selection of the third charging speed or the fourth charging speed corresponds to a selection of a rising slope size of a control signal BLSHF.

7. The method of claim 6, wherein the third charging speed or the fourth charging speed is selected by controlling the time it takes for the control signal BLSHF to reach a target level.

8. A nonvolatile memory device comprising:
   a cell array comprising a plurality of memory cells;
   a page buffer configured to provide a setup voltage or a precharge voltage to a bitline of a selected memory cell where a program operation is performed; and
   a control logic configured to control the page buffer such that the bitline is charged at a first charging speed or a second charging speed slower than the first charging speed based on a loop count or a level of a program pulse to be applied to the selected memory cell when the program operation is performed.

9. The nonvolatile memory device of claim 8, wherein the control logic comprises a bitline setup controller detecting whether the loop count or the level of the program pulse is within a specific range.

10. The nonvolatile memory device of claim 9, wherein the page buffer comprises a select transistor N1 configured to supply the setup voltage to the bitline, and the bitline setup controller is configured to select any one of the first charging speed and the second charging speed by controlling a rising slope size of a control signal BLSHF being provided to a gate of the select transistor N1.

11. The nonvolatile memory device of claim 9, wherein bitline setup controller comprises a storage device configured to provide information about the specific range.

12. The nonvolatile memory device of claim 8, wherein the page buffer comprises a setup circuit configured to provide the setup voltage to the bitline under control of the control logic.

13. The nonvolatile memory device of claim 8, wherein the page buffer comprises a load transistor configured to provide the precharge voltage to the bitline under control of the control logic.

14. A system configured to program a memory cell of a nonvolatile memory device by executing a plurality of program loops, the system comprising:
   a control unit configured to detect whether a loop count or a level of a program pulse to be applied to the memory cell is within a specific range, wherein the specific range is an operation section in which a level of a current peak flowing into the bitline increases up to a reference value or more;
   a charging unit configured to charge a bitline of the memory cell at a first charging speed or a second charging speed slower than the first charging speed according to a result of the detection; and a program pulse application unit configured to apply the program pulse to a wordline of the memory cell.

15. The system of claim 14, wherein when the loop count or the level of the program pulse to be applied to the memory cell is within the specific range, the bitline is charged at the second charging speed.

16. The system of claim 14, wherein a selection of the first charging speed and the second charging speed corresponds to a selection of a rising slope size of a control signal BLSHF being provided to a gate of a selection transistor N1 supplying a setup voltage to the bitline.

17. The system of claim 16, wherein the first charging speed or the second charging speed is selected by controlling a time taken for the control signal to reach a target level.

18. The system of claim 14, wherein the control unit is further configured to detect whether the loop count or the level of the program pulse is within the specific range, the charging unit is further configured to charge the bitline at a third charging speed or a fourth charging speed slower than the third charging speed according to the detecting result, and the program pulse application unit is further configured to apply a program verifying pulse to the wordline.

19. The system of claim 18, wherein a selection of the third charging speed or the fourth charging speed corresponds to a selection of a rising slope size of a control signal BLSHF.

20. The system of claim 19, wherein the third charging speed or the fourth charging speed is selected by controlling the time it takes for the control signal BLSHF to reach a target level.

* * * * *